United States Patent
Preisler et al.

(10) Patent No.: US 10,622,262 B2
(45) Date of Patent: Apr. 14, 2020

(54) HIGH PERFORMANCE SIGE HETEROJUNCTION BIPOLAR TRANSISTORS BUILT ON THIN FILM SILICON-ON-INSULATOR SUBSTRATES FOR RADIO FREQUENCY APPLICATIONS

(71) Applicant: Newport Fab, LLC, Newport Beach, CA (US)

(72) Inventors: Edward J. Preisler, San Clemente, CA (US); Paul D. Hurwitz, Irvine, CA (US); Marco Racanelli, Santa Ana, CA (US); David J. Howard, Irvine, CA (US)

(73) Assignee: Newport Fab LLC, Newport Beach, CA (US)

( * ) Notice: Subject to any disclaimer, the term of this patent is extended or adjusted under 35 U.S.C. 154(b) by 0 days.

(21) Appl. No.: 15/727,159

(22) Filed: Oct. 6, 2017

(65) Prior Publication Data
US 2019/0109054 A1    Apr. 11, 2019

(51) Int. Cl.
| | |
|---|---|
| H01L 21/84 | (2006.01) |
| H01L 29/66 | (2006.01) |
| H01L 21/8249 | (2006.01) |
| H01L 27/06 | (2006.01) |
| H01L 29/737 | (2006.01) |
| H01L 27/12 | (2006.01) |
| H01L 29/165 | (2006.01) |

(Continued)

(52) U.S. Cl.
CPC .......... *H01L 21/84* (2013.01); *H01L 27/1203* (2013.01); *H01L 29/0692* (2013.01); *H01L 29/1004* (2013.01); *H01L 29/165* (2013.01); *H01L 29/66242* (2013.01); *H01L 29/66272* (2013.01); *H01L 29/737* (2013.01); *H01L 29/7371* (2013.01); *H01L 21/8249* (2013.01); *H01L 27/0623* (2013.01)

(58) Field of Classification Search
CPC ................... H01L 29/66242; H01L 29/737
See application file for complete search history.

(56) References Cited

U.S. PATENT DOCUMENTS

| | | |
|---|---|---|
| 9,548,298 B1 | 1/2017 | Tian |
| 2003/0082882 A1 | 5/2003 | Babcock |

(Continued)

*Primary Examiner* — Matthew L Reames
*Assistant Examiner* — John A Bodnar
(74) *Attorney, Agent, or Firm* — Bever, Hoffman & Harms, LLP

(57) ABSTRACT

A silicon-on-insulator (SOI) CMOS transistor and a SOI heterojunction bipolar transistor (HBT) are fabricated on the same semiconductor substrate. First and second SOI regions are formed over the semiconductor substrate. A SOI CMOS transistor is fabricated in the first SOI region, and a collector region of the SOI HBT is fabricated in the second SOI region. The collector region can be formed by performing a first implant to a local collector region in the second SOI region, and performing a second implant to an extrinsic collector region in the second SOI region, wherein the extrinsic collector region is separated from the local collector region. A SiGe base is formed over the collector region, wherein a dielectric structure separates portions of the SiGe region and the extrinsic collector region. The SOI CMOS transistor and SOI HBT may be used to implement a front end module of an RF system.

22 Claims, 19 Drawing Sheets

(51) Int. Cl.
*H01L 29/10* (2006.01)
*H01L 29/06* (2006.01)

(56) References Cited

U.S. PATENT DOCUMENTS

| | | | |
|---|---|---|---|
| 2005/0139921 A1* | 6/2005 | Kang | H01L 21/84 257/347 |
| 2007/0108555 A1* | 5/2007 | Lenoble | H01L 29/0821 257/592 |
| 2007/0287234 A1 | 12/2007 | Kang | |
| 2008/0099806 A1* | 5/2008 | Kang | H01L 27/14609 257/292 |
| 2008/0111154 A1* | 5/2008 | Voldman | H01L 21/8249 257/192 |
| 2015/0287642 A1* | 10/2015 | Chang | H01L 21/8249 438/236 |

* cited by examiner

HIGH PERFORMANCE SIGE HETEROJUNCTION BIPOLAR TRANSISTORS BUILT ON THIN FILM SILICON-ON-INSULATOR SUBSTRATES FOR RADIO FREQUENCY APPLICATIONS

FIELD OF THE INVENTION

The present invention relates to an improved process that allows for the fabrication of silicon-on-insulator (SOI) CMOS devices and SOI silicon-germanium (SiGe) heterojunction bipolar transistor (HBT) devices on the same wafer, and structures formed using the same. More specifically, the present invention relates to the fabrication of SOI HBT devices using a process that is largely consistent with a conventional process used to fabricate SOI CMOS devices.

RELATED ART

Two components needed in every radio frequency (RF) front-end-module (FEM) include an RF switch and one or more amplifiers. For modern cell phone based FEMs, the technology of choice for implementing RF switches is silicon-on-insulator (SOI) CMOS transistors, due to the excellent performance provided by these transistors in terms of low RF losses (due to the low resistance exhibited by SOI CMOS transistors in the on-state, and the low capacitance exhibited by SOI CMOS transistors in the off-state), high linearity (due to low harmonic generation that avoids mixing of unwanted signals in nearby frequency bands), and low cost.

For RF receiver circuits in a FEM, low-noise amplifiers (LNAs) can be built using a variety of devices, but silicon germanium (SiGe) heterojunction bipolar transistors (HBTs) are commonly used for the most demanding LNA applications because these transistors exhibit low noise, high gain, high linearity, and low power consumption, and can be fabricated at a low cost.

For RF transmitter circuits in a FEM, power amplifiers (PAs) can be built using a variety of devices, but SiGe HBTs offer a good compromise between cost and performance, wherein PA performance is mainly related to high gain, high linearity and high efficiency (i.e., the ratio of RF power output to DC power consumed).

However, monolithic integration of SiGe HBTs on the types of substrates used in RF SOI CMOS technologies has not been implemented due to complexity of the integration. Thus, in conventional commercial devices, the combination of an RF switch and the required amplifiers in a FEM has been accomplished using one of three methods.

In a first method, the RF switch and the amplifiers can be fabricated on separate integrated circuit (IC) chips, and then packaged together on a printed circuit board (or using another macroscopic-scale packaging method). However, this method requires the cost of packaging the two IC chips. This method also incurs parasitic RF losses due to the bond wires and packaging associated with the two IC chips. This method also results in a relatively large space being consumed by the physical size of the two packaged IC chips, which can be disadvantageous in densely packed cell phones.

In a second method, both the RF switch and the amplifiers can be fabricated using devices available in a conventional SOI CMOS process. As described above, this method allows for the fabrication of an optimized RF switch. However, fabricating amplifiers using SOI CMOS devices optimized for an RF switch results in amplifiers having inadequate performance. This method also exhibits a lack of scalability, because as the SOI CMOS devices are further optimized for RF switch performance, the amplifiers will have to be totally redesigned, or will fail to operate properly.

In a third method, both the RF switch and the amplifiers can be fabricated using devices available in a conventional SiGe BiCMOS process. As described above, this method allows for the fabrication of optimized amplifiers. However, fabricating an RF switch using SiGe BiCMOS devices results in an RF switch having inadequate performance, mainly due to the fact that SiGe BiCMOS processes do not allow for the formation of SOI devices, which are necessary for high performance RF switches.

It would therefore be desirable to have an improved method and structure for implementing SOI CMOS transistors (for an RF switch) and SiGe HBT transistors (for LNAs and PAs) on a single integrated circuit chip.

SUMMARY

Accordingly, the present invention provides a method of fabricating a silicon-on-insulator (SOI) CMOS transistor and a SOI heterojunction bipolar transistor (HBT) on the same semiconductor substrate. In one embodiment the method includes: forming a first SOI region and a second SOI region over the substrate, fabricating a SOI CMOS transistor in the first SOI region, and fabricating a collector region of the SOI HBT in the second SOI region. In one embodiment, the collector region is formed by a series of implants into the second SOI region. A local collector implant is performed through a first mask to introduce an impurity of a first conductivity type into a local collector region in the second SOI region. An extrinsic collector implant is performed through a second mask to introduce an impurity of the first conductivity type into an extrinsic collector region in the second SOI region, wherein the extrinsic collector region is separated from the local collector region. A blanket collector implant may be performed over the entire second SOI region, thereby controlling the doping of a sub-collector region between the local collector region and the extrinsic collector region. A collector contact/sinker region adjacent to the extrinsic collector region may be exposed during all three collector implants. By performing separate implants for the local collector region and the extrinsic collector region, the dopant concentrations (and widths/spacings) of these collector regions can be precisely controlled (thereby controlling the resistance of the collector region).

In accordance with another embodiment, a dielectric spacer layer formed over the first and second SOI regions is etched to expose the local collector region, the sub-collector region and a first portion of the extrinsic collector region, wherein the remaining portion of the etched dielectric spacer layer extends over a second portion of the extrinsic collector region (as well as the collector contact/sinker region). A silicon germanium (SiGe) base layer having a second conductivity type is formed over the resulting structure. The SiGe layer is then etched to form a SiGe base structure. The dielectric spacer layer is also etched, thereby exposing the collector contact/sinker region. A portion of the dielectric spacer layer remains as a dielectric structure, wherein this dielectric structure is located under an edge of the SiGe base structure and over the second portion of the extrinsic collector region. This dielectric structure provides isolation between the edge of the SiGe base structure and the second portion of the extrinsic collector region. Note that the isolation function performed by this dielectric structure is typically performed by a shallow trench isolation (STI) region in a conventional bulk SiGe HBT device, but that such an STI region is unable to perform such a function within the second SOI region (because such an STI region would extend all the way through the second SOI region, thereby splitting the collector region into two isolated collector regions). A polysilicon emitter structure having the first conductivity type is formed over the SiGe base region to complete the general SOI HBT device structure.

In accordance with another embodiment, the present invention includes a semiconductor structure including a semiconductor substrate, a buried dielectric layer located over the semiconductor substrate, a first thin silicon region located over the buried dielectric layer, wherein a silicon-on-insulator (SOI) CMOS transistor is fabricated in the first thin silicon region, a second thin silicon region located over the buried dielectric layer, wherein a collector of a heterojunction bipolar transistor (HBT) device is fabricated in the second thin silicon region, and a shallow trench isolation (STI) structure that isolates the SOI CMOS transistor from the collector of the HBT device, wherein the STI structure extends to the buried dielectric layer. In a particular embodiment, the collector of the HBT device includes a local collector region that extends entirely through the second thin silicon region, an extrinsic collector region that extends entirely through the second thin silicon region, and a sub-collector region that extends entirely through the second thin silicon region and separates the local collector region and the extrinsic collector region. The local collector region and the extrinsic collector region may have different dopant concentrations. In a particular embodiment, the extrinsic collector region and the sub-collector region have a series resistance of about 10 Ohms or less.

In accordance with another embodiment, the HBT device further includes a silicon germanium (SiGe) base region located over the collector and an emitter located over the SiGe base region. A dielectric spacer structure may be located over a portion of the extrinsic collector region, wherein the dielectric spacer structure separates this portion of the extrinsic collector region from an edge portion of the SiGe base region.

In accordance with a particular application, the SOI CMOS transistor is included in radio frequency (RF) switch of a front end module (FEM) of an RF device, and the HBT device is included in an amplifier of the FEM.

The present invention will be more fully understood in view of the following description and drawings.

DETAILED DESCRIPTION

In general, the present invention provides a method for fabricating SOI CMOS devices and SOI SiGe HBT devices on the same semiconductor wafer. The wafer is processed to include two regions, including a first (SOI CMOS) region that includes a silicon-on-insulator structure for the formation of SOI CMOS transistors, and a second (SOI HBT) region that includes a silicon-on-insulator structure for the formation of SOI HBT devices, such as SOI SiGe HBTs. One or more isolation structures, including shallow trench isolation (STI) structures, separate the SOI CMOS region from the SOI HBT region. In one embodiment, the method is used to fabricate a front end module (FEM) of an RF system on a single wafer, wherein SOI CMOS transistors fabricated in the SOI CMOS region are used to implement RF switches of the FEM, and SOI SiGe HBTs fabricated in the SOI HBT region are used to implement amplifiers (e.g., LNAs and PAs) of the FEM. The present invention will now be described in more detail.

Figure 1:
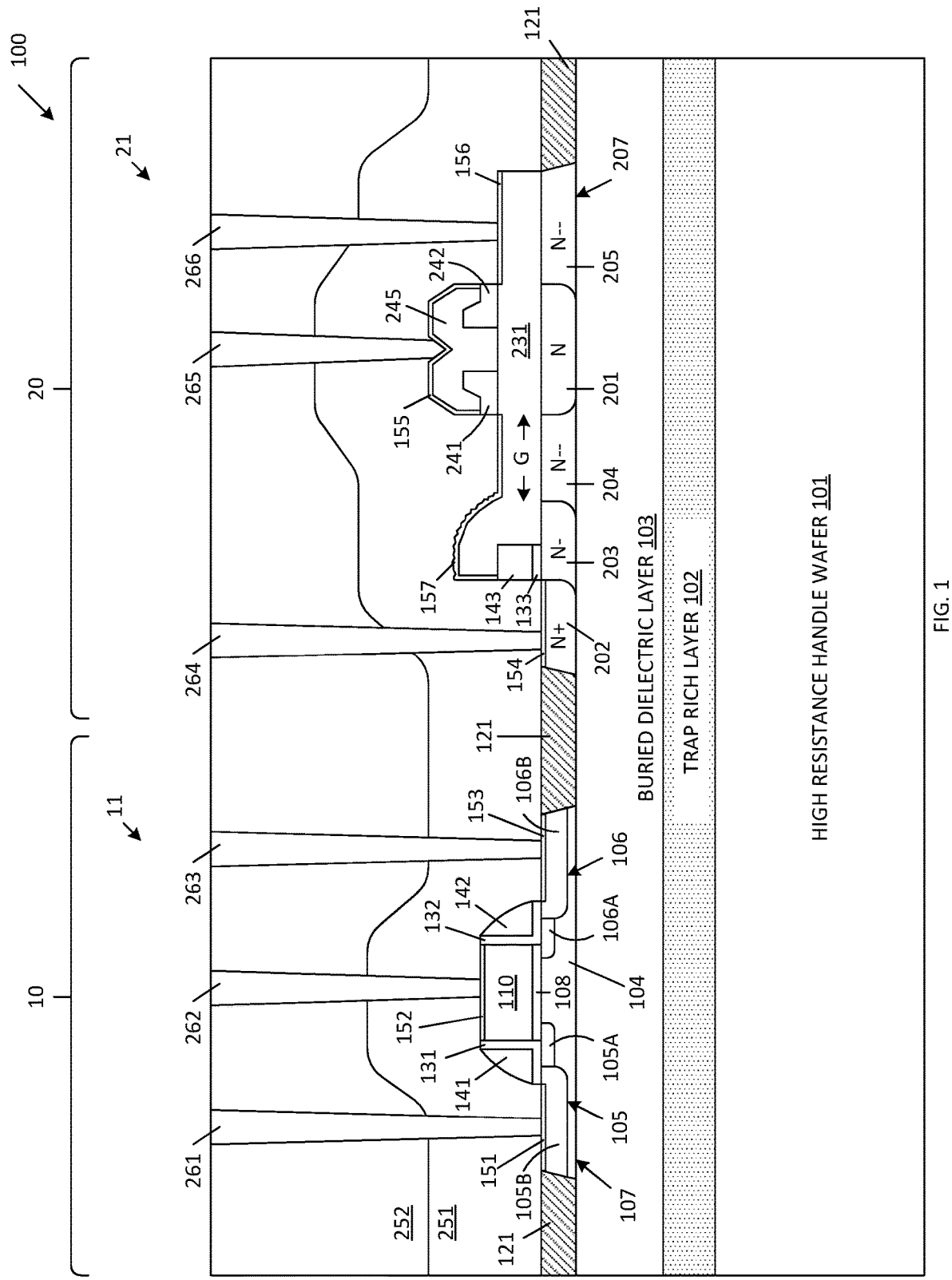
FIG. 1 is cross sectional diagram illustrating a semiconductor structure that includes a SOI CMOS device fabricated in a SOI CMOS region, and a SOI HBT device fabricated in a SOI HBT region, in accordance with one embodiment of the present invention.

FIG. 1 is cross sectional diagram illustrating a semiconductor structure 100 that includes a SOI CMOS device 11 fabricated in a SOI CMOS region 10, and a SOI HBT device 21 fabricated in a SOI HBT region 20 in accordance with one embodiment of the present invention. Semiconductor structure 100 includes high-resistance semiconductor handle wafer 101, trap-rich semiconductor region 102, buried dielectric (oxide) layer 103 and thin silicon-on-insulator (SOI) regions 107 and 207 (which are isolated by shallow trench isolation structure 121). SOI CMOS device 11 is formed in thin silicon region 107, and SOI HBT device 21 is formed in thin silicon region 207. SOI CMOS device 11 includes channel/body region 104, source/drain regions 105-106 (which include lightly doped source/drain regions 105A-106A, respectively, and source/drain contact regions 105B-106B, respectively), gate dielectric structure 108, gate electrode 110, sidewall dielectric structures 131-132, dielectric sidewall spacers 141-142 and metal silicide contact structures 151-153. SOI HBT device 21 includes local collector region 201, collector contact/sinker region 202, extrinsic collector region 203 and lightly doped sub-collector regions 204-205 (which are formed in thin silicon region 207), dielectric spacer structures 133 and 143, silicon germanium (SiGe) base structure 231, dielectric emitter spacer structures 241-242, polysilicon emitter structure 245, and metal silicide contact structures 154-157. Pre-metal dielectric layers 251-252 are formed over SOI CMOS device 11 and SOI HBT device 21. Contacts 261-266 extend through pre-metal dielectric layers 251-252 to provide electrical connections to metal silicide structures 151-156, respectively.

FIGS. 2A-2J are cross sectional diagrams illustrating the fabrication of SOI CMOS device 11 and SOI HBT device 21 in accordance with various embodiments of the present invention. FIGS. 3A-3D are top views of the SOI HBT region 20 during different stages of fabrication in accordance with various embodiments of the present invention.

Figure 2A:
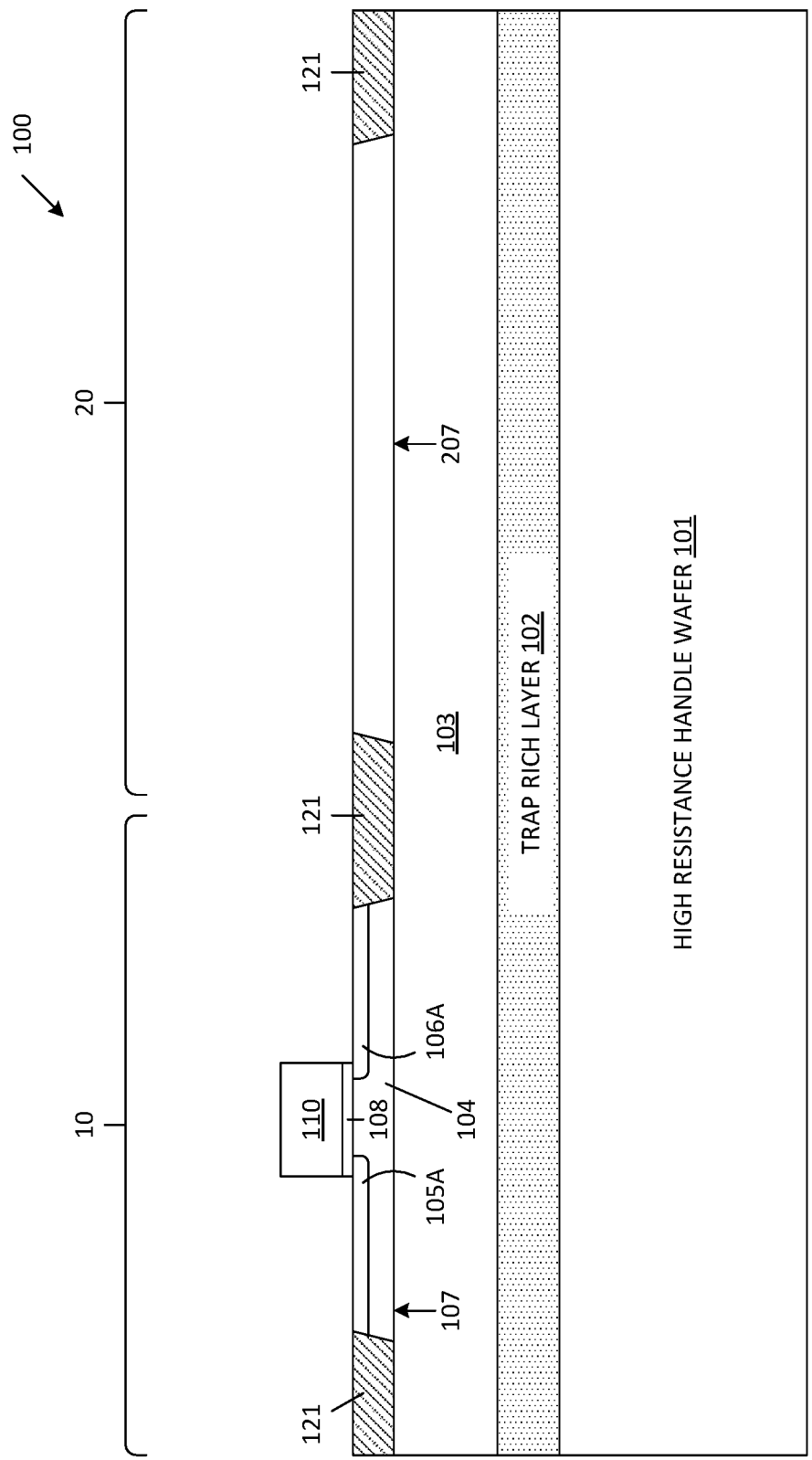
FIGS. 2A, 2B, 2C, 2D, 2E, 2F, 2G, 2H, 2I and 2J are cross sectional diagrams illustrating the fabrication of the SOI CMOS device and SOI HBT device of FIG. 1 in accordance with various embodiments of the present invention.

As illustrated by FIG. 2A, SOI CMOS device 11 and SOI HBT device 21 are fabricated on the same high-resistance semiconductor handle wafer 101. The high-resistance handle wafer 101 reduces substrate losses associated with the SOI CMOS device 11 (and passive devices), which are used to implement RF switches. In one embodiment, high-resistivity handle wafer 101 is p-type monocrystalline silicon having a resistivity greater than 500 Ω-cm, and a thickness of at least about 500 microns. SOI CMOS region 10 (wherein SOI CMOS devices such as SOI CMOS transistor 11 are fabricated) and SOI HBT region 20 (wherein SOI HBT devices such as SOI SiGe HBT device 21 are fabricated) are defined on wafer 101. Although the fabrication of a single SOI CMOS device 11 in SOI CMOS region 10 is described, it is understood that additional SOI CMOS devices can be readily fabricated in SOI CMOS region 10 (or similar SOI CMOS regions). Similarly, although the fabrication of a single SOI SiGe HBT device 21 in SOI HBT region 20 is described, it is understood that additional SOI SiGe HBT devices can be readily fabricated in similar SOI HBT regions.

As illustrated by FIG. 2A, a trap-rich region 102 is engineered at an upper surface of the handle wafer 101. In accordance with one embodiment, trap-rich region 102 is formed by wafer-bonding a silicon handle wafer with polysilicon grown on top of it to a typical SOI donor wafer. Trap rich region 102 has a thickness in the range of about 0.5 to 4 microns, although other thicknesses are possible in other embodiments. Trap rich region 102 serves to improve the linearity of active and passive devices fabricated on the overlying SOI layers.

A buried dielectric layer 103 is located over trap-rich layer 102. In one embodiment buried dielectric layer 103 is silicon oxide having a thickness in the range of about 0.1 to 1 um. Thin monocrystalline silicon (SOI) regions 107 and 207 are formed over buried dielectric layer 103. In one embodiment, each of the thin silicon regions 107 and 207 has a thickness of about 100 nanometers, although other thicknesses are possible in other embodiments. A shallow trench isolation (STI) structure 121 isolates the thin silicon regions 107 and 207. Gate dielectric structure 108 and polysilicon gate electrode 110 are formed over thin silicon region 107, as illustrated. Lightly doped source/drain regions 105A and 106A are formed in thin silicon region 107. In one embodiment, thin silicon region 107 (and therefore channel/body region 104) is a p-type region, and lightly doped source/drain regions 105A and 106A are n-type regions. The fabrication of wafer 101, trap rich region 102, buried dielectric layer 103, thin SOI regions 107 and 207, gate dielectric layer 108, gate electrode 110 and STI structure 121 can be implemented in accordance with conventional SOI CMOS process technologies.

Figure 2B:
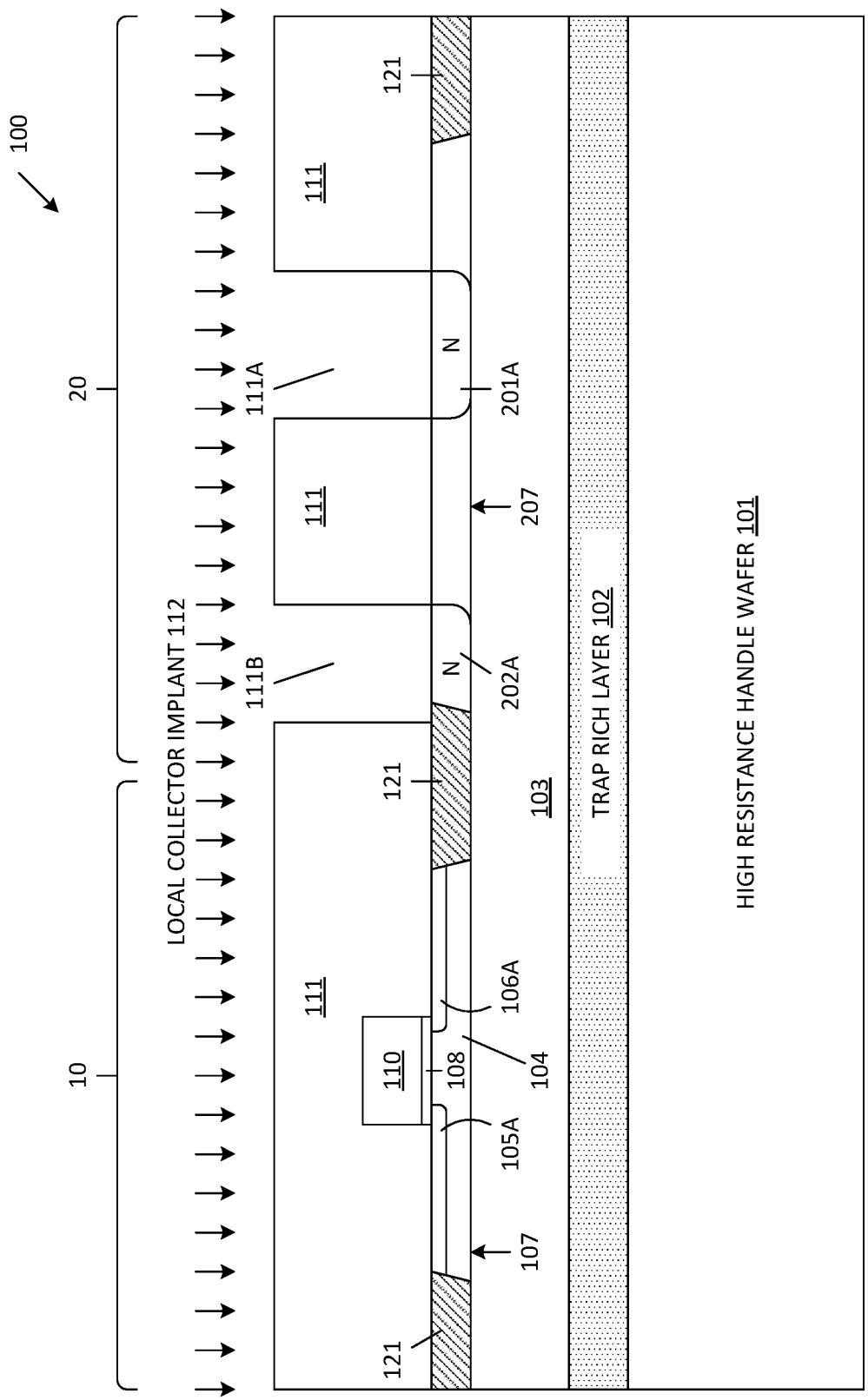

As illustrated by FIG. 2B, a first collector mask 111 is formed over the structure of FIG. 2A. First collector mask 111 includes a first opening 111A that defines the location of a local collector (LC) of the SOI HBT device 21, and a second opening 111B that defines the location of a collector sinker/contact region of the SOI HBT device 21. A local collector implant 112 is performed through mask 111, thereby forming n-type local collector region 201A and n-type collector sinker region 202A, as illustrated. In one embodiment, this implant 112 is performed by implanting phosphorus or arsenic at a concentration of about 1e18 to 1e20 cm-3 and an implant energy of about 0-20 keV.

Figure 3A:
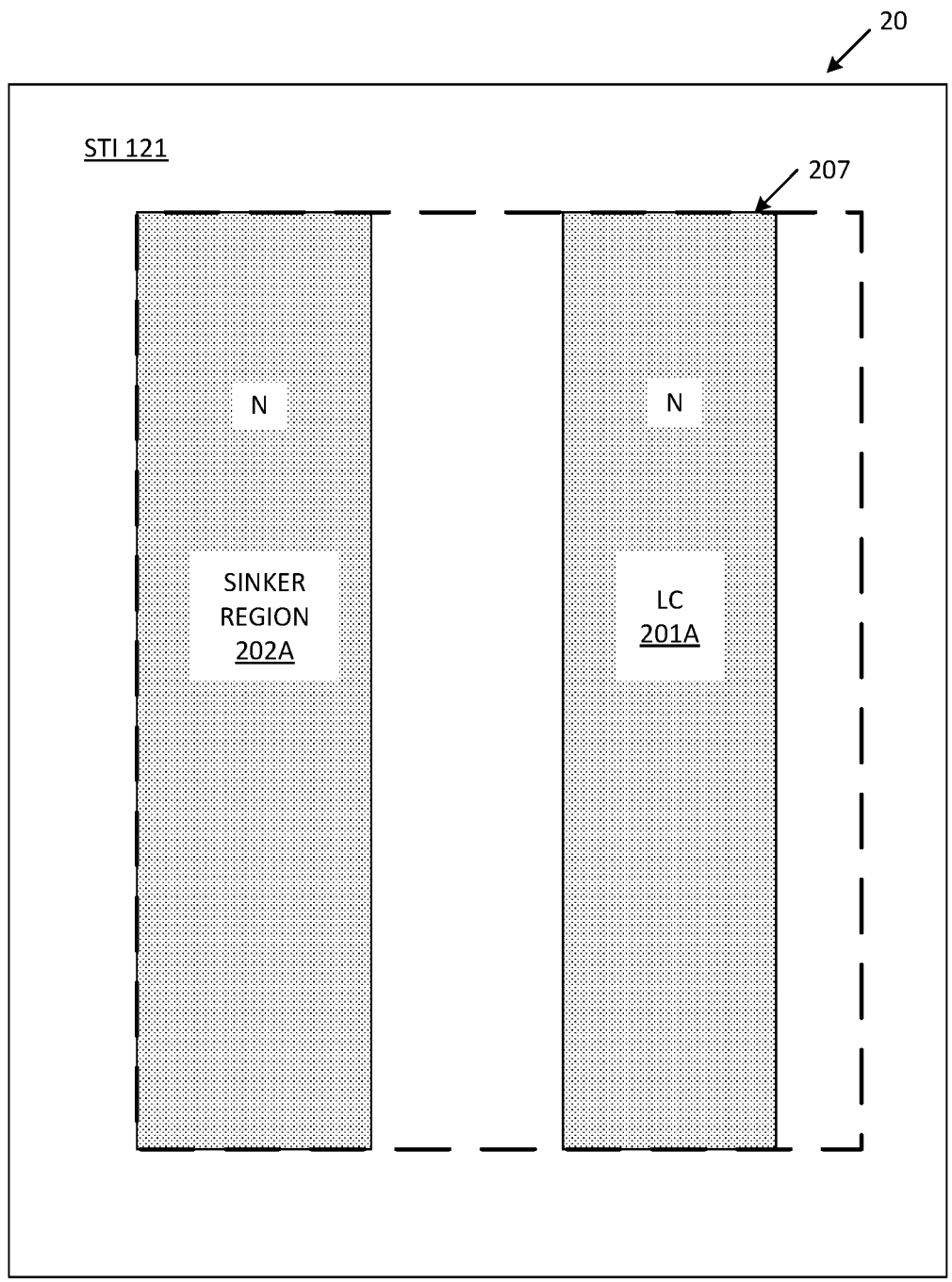
FIGS. 3A, 3B, 3C and 3D are top views of the SOI SiGe HBT region of FIG. 1 during different stages of fabrication in accordance with various embodiments of the present invention.

FIG. 3A is a top layout view of SOI HBT region 20 after local collector implant 112 has been performed, which illustrates n-type local collector (LC) region 201A, n-type sinker region 202A, thin SOI region 207 and STI region 121, in accordance with one embodiment of the present invention.

Figure 2C:
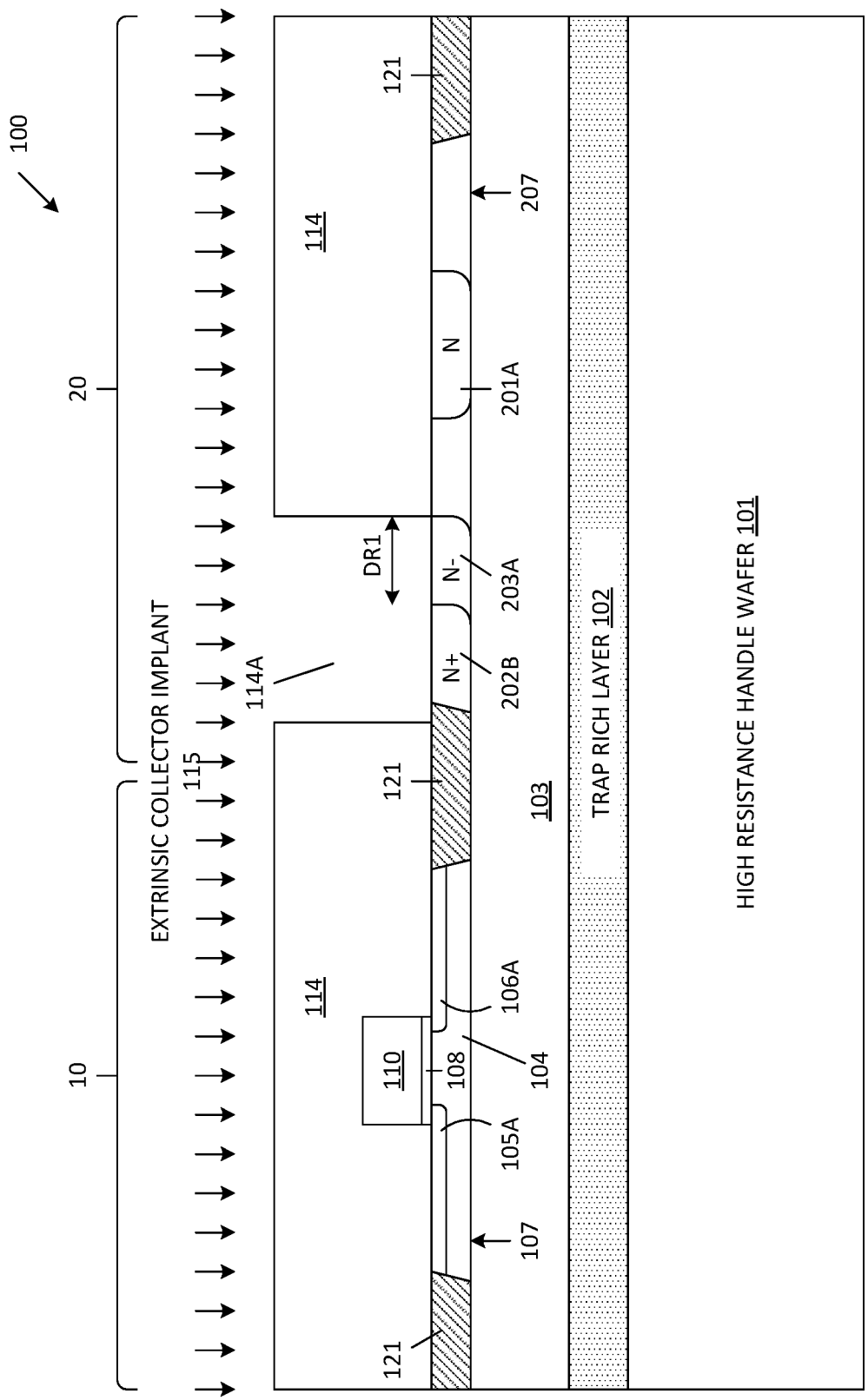

As illustrated by FIG. 2C, the first collector mask 111 is removed, and a second collector mask 114 is formed over the resulting structure. Second collector mask 114 includes an opening 114A that defines the location of an extrinsic collector (EC) region of the SOI HBT device 21. An n-type extrinsic collector implant 115 is performed through mask 114, thereby forming n-type extrinsic collector region 203A (and increasing the dopant concentration in sinker region 202A, thereby forming N+ sinker region 202B). In one embodiment, n-type implant 115 is performed by implanting phosphorus or arsenic at a concentration of about 1e16 to 1e18 cm-3 and an implant energy of about 0-20 keV. Advantageously, different implants 112/115 are used to form the local collector region 201A and the extrinsic collector region 203A, thereby allowing these implants to be separately optimized. In one embodiment, the dopant concentration of local collector region 201A is greater than the dopant concentration of extrinsic collector region 203A. The use of different implants 112/115 also allows the width (DR1) and placement of the extrinsic collector region 203A to be precisely controlled. In an alternate embodiment, the second collector mask 114 is modified such that the opening 114A only exposes the extrinsic collector region 203A.

Figure 3B:
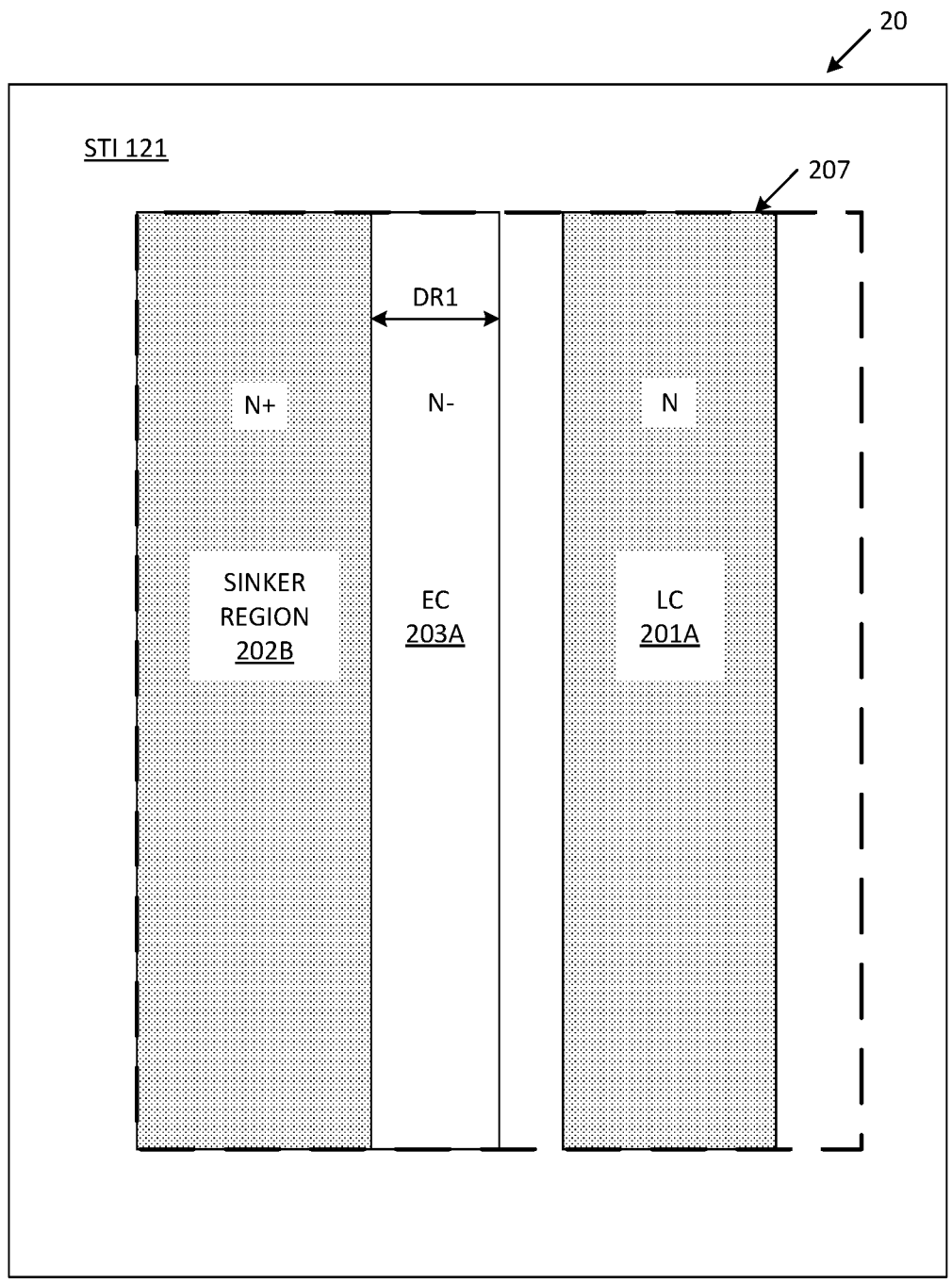

FIG. 3B is a top layout view of SOI HBT region 20 after the implant 115 of FIG. 2C has been performed, which illustrates n-type local collector (LC) region 201A, n-type sinker region 202B, n-type extrinsic collector region 203A, SOI region 207 and STI region 121, in accordance with one embodiment of the present invention.

Figure 2D:
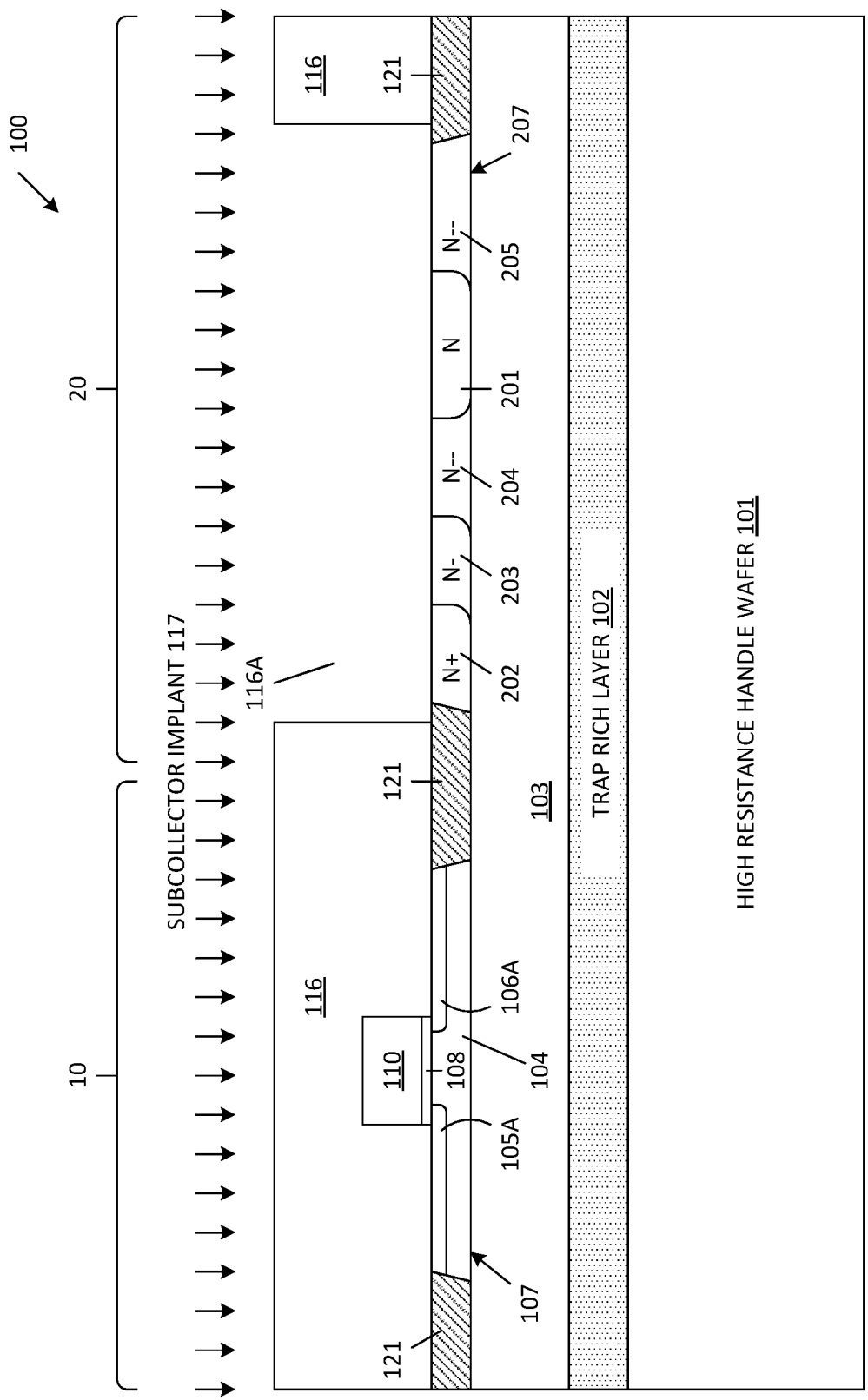

As illustrated by FIG. 2D, the second collector mask 114 is removed, and a third collector mask 116 is formed over the resulting structure. Third collector mask 116 includes an opening 116A that exposes the entire collector region (e.g., SOI region 207) of the SOI HBT device 21. A blanket sub-collector implant 117 is performed through the third collector mask 116, thereby forming n-type sub-collector (SC) regions 204-205 (and increasing the dopant concentration in local collector region 201A, sinker region 202B and extrinsic collector region 203A, thereby forming N local collector region 201, N+ sinker region 202 and N− extrinsic collector region 203, respectively). In one embodiment, the sub-collector implant 117 is performed by implanting phosphorus or arsenic at a concentration of about 1e14 to 1e16 cm-3 and an implant energy of about 0-20 keV.

Figure 3C:
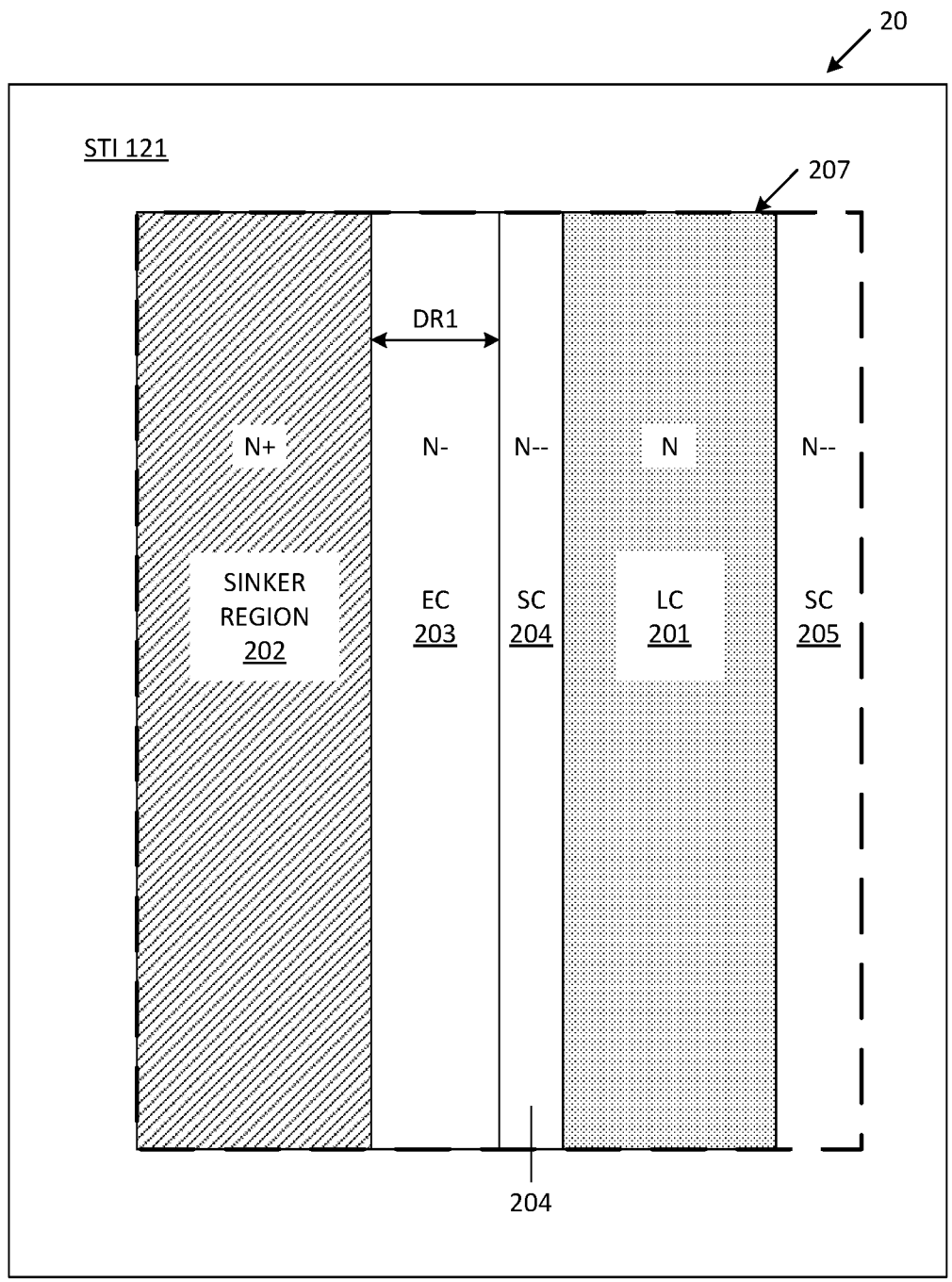

FIG. 3C is a top layout view of SOI HBT region 20 after the implant 117 of FIG. 2D has been performed, which illustrates n-type local collector (LC) region 201, n-type collector sinker/contact region 202, n-type extrinsic collector (EC) region 203, n-type sub-collector (SC) regions 204-205, SOI region 207 and STI region 121, in accordance with one embodiment of the present invention.

Figure 2E:
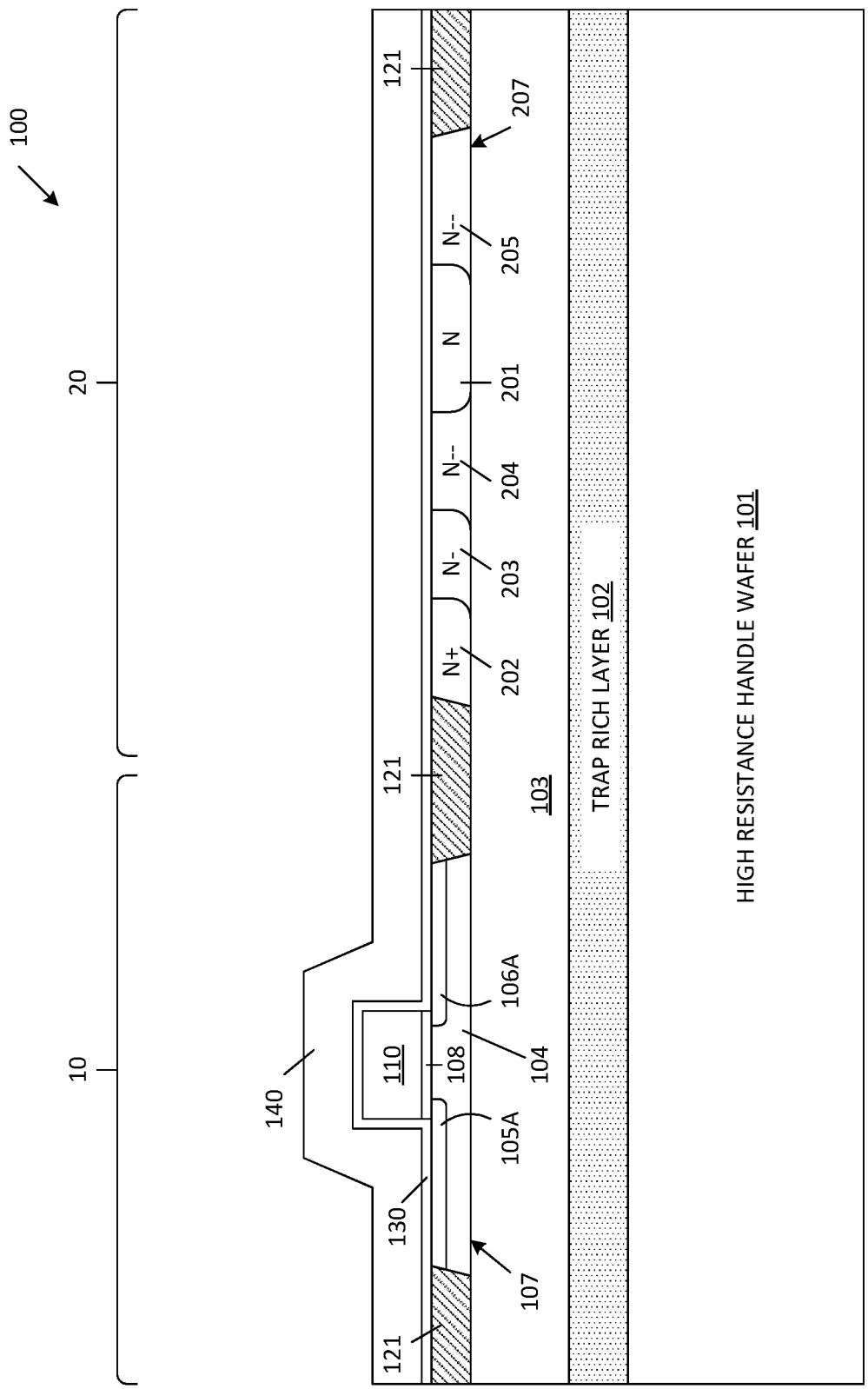
Figure 2F:
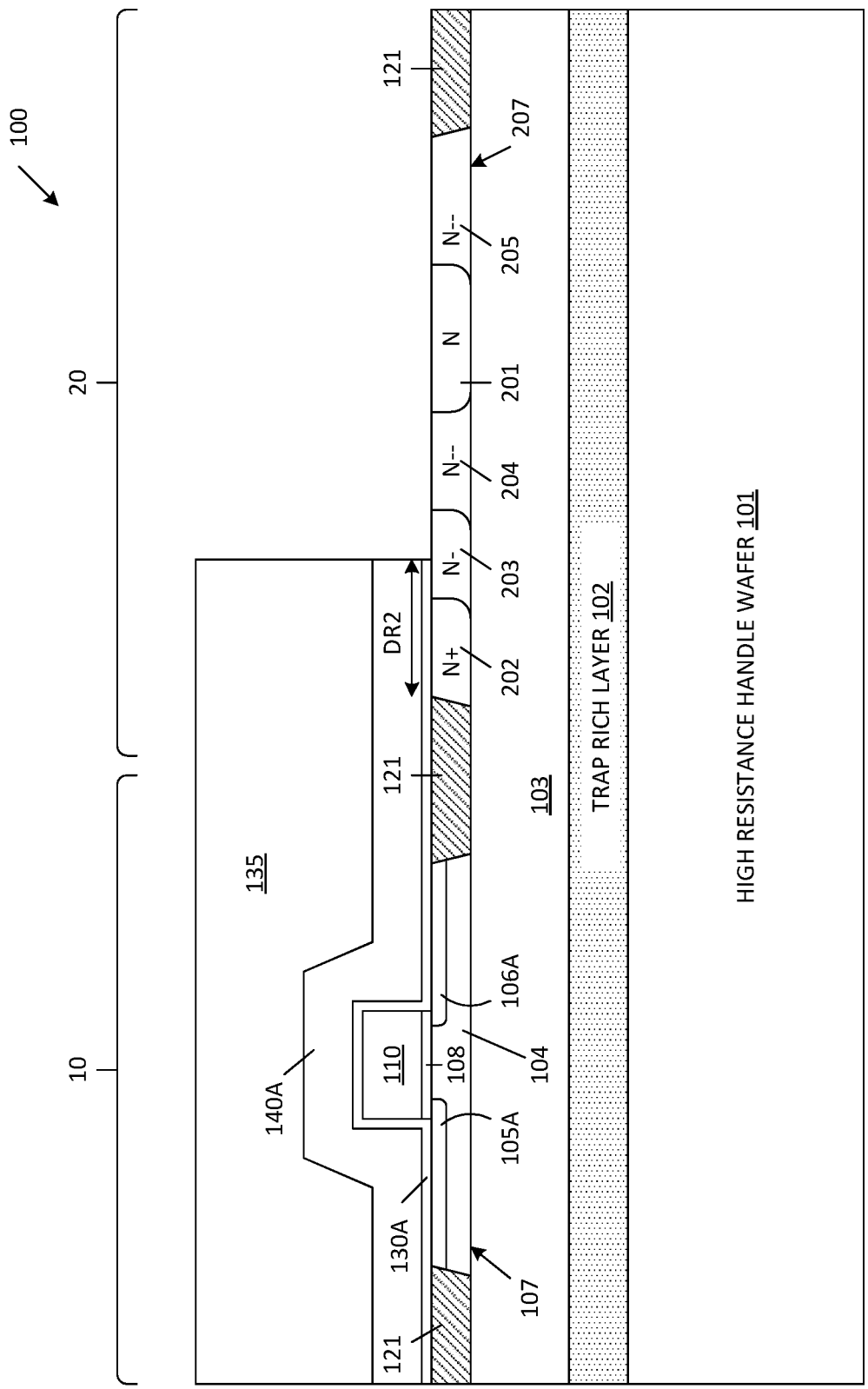

As illustrated by FIG. 2E, the third collector mask 116 is removed and a thin oxide layer 130 and a silicon nitride spacer layer 140 are deposited over the resulting structure. As illustrated by FIG. 2F, a mask 135 is formed over the nitride spacer layer 140, and an etch is performed through the mask 135, thereby leaving thin oxide region 130A and silicon nitride spacer region 140A. Mask 135 is located such that the thin oxide region 130A and the silicon nitride spacer region 140A overlap the collector sinker/contact region 202 and the extrinsic collector region 203 by a distance DR2. More specifically, the thin oxide region 130A and silicon nitride spacer region 140A extend partially, but not entirely over the extrinsic collector region 203. This extension is critical because there can be no STI isolation between the local collector region 201 and the extrinsic collector region 203 (as found in conventional bulk SiGe HBTs), because all STI regions (e.g., STI region 121) extend all the way down to the buried dielectric layer 103 in the SOI structure 100. As described in more detail below, the portions of regions 130A/140A that extend over extrinsic collector region 203 minimize the area of overlap between the extrinsic collector region 203 and the overlying base region 231, and also provides isolation between the metal silicide regions 154 and 157 formed over the collector sinker/contact region 202 and the overlying SiGe base region 231.

Figure 2G:
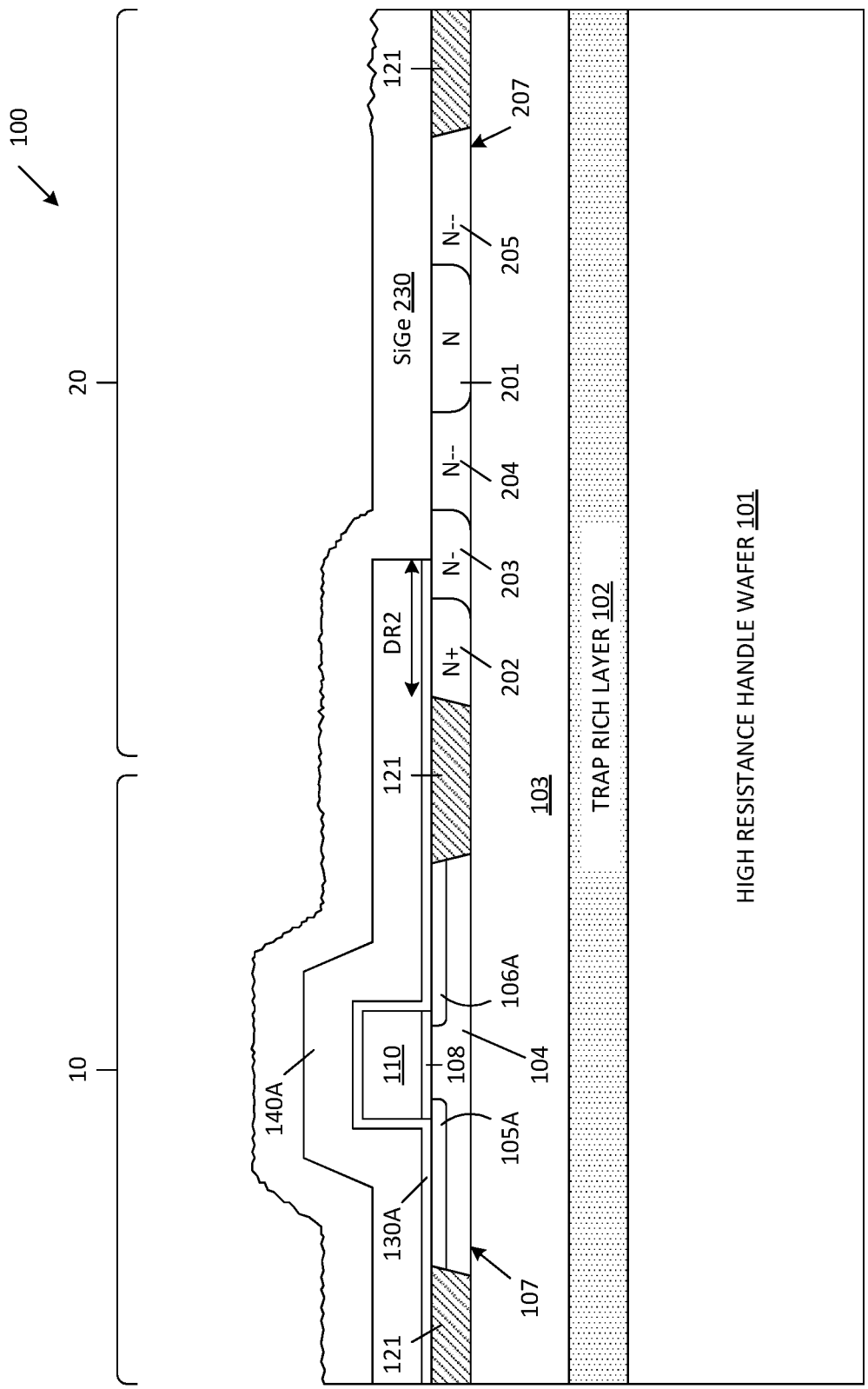

As illustrated by FIG. 2G, the mask 135 is stripped, and a p-type silicon-germanium (SiGe) layer 230 is formed over the resulting structure using conventional processing steps. In accordance with one embodiment SiGe layer 230 has a thickness of about 500-1500 Angstroms, and a spatially varying atomic Ge concentration and spatially varying p-type doping profile typical for state-of-the-art SiGe HBT structures.

Figure 2H:
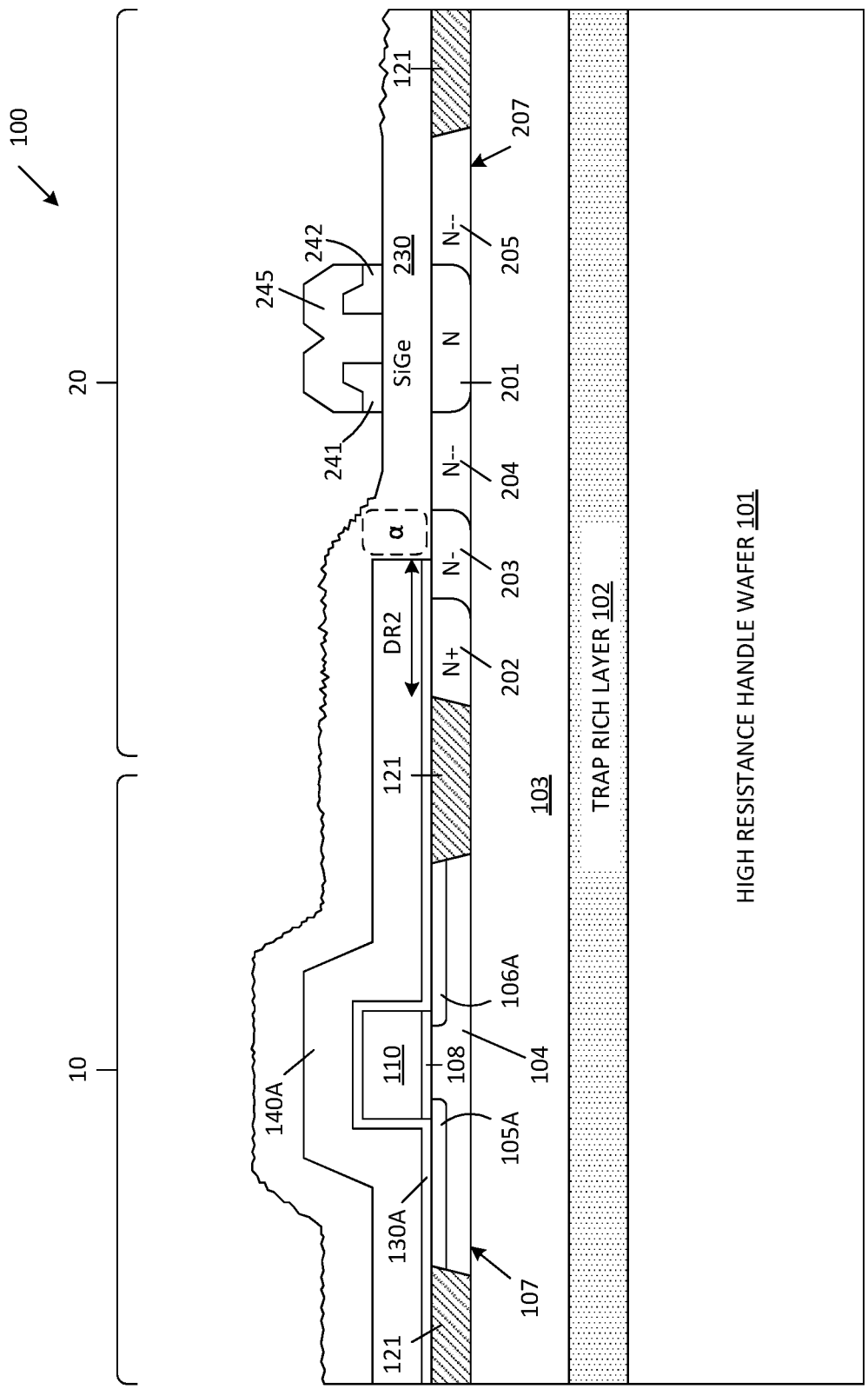

As illustrated by FIG. 2H, dielectric emitter spacers 241-242 and n-type polysilicon emitter 245 and are formed over SiGe layer 230 using conventional processing steps, such as those described in U.S. Pat. No. 6,716,711. Emitter 245 is aligned with the underlying local collector region 201. A critical region in this process is the area of overlap between the extrinsic base region (labeled 'a' in FIG. 2H) and the extrinsic collector region 203. Extensive overlapping of these regions will undesirably lead to an excessive capacitance between the extrinsic collector 203 and the extrinsic base region α, as well as an excessive a DC leakage current between the extrinsic collector 203 and the extrinsic base region α. Positioning the ends of thin oxide region 130A and silicon nitride spacer region 140A over extrinsic collector region 203 in the manner described above advantageously allows the area of overlap between the extrinsic base region α and the extrinsic collector region 203 to be controlled (minimized).

Figure 2I:
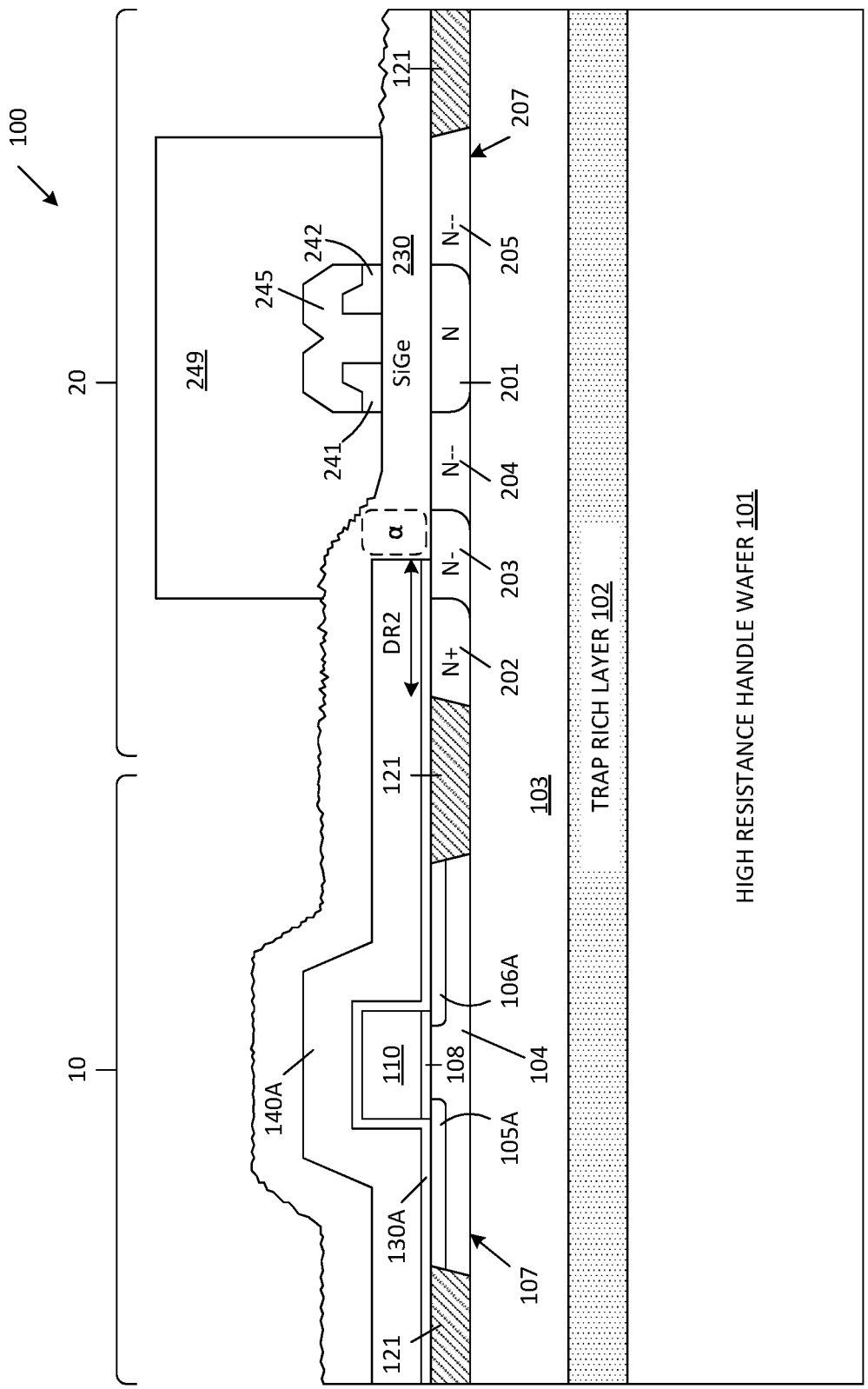
Figure 2J:
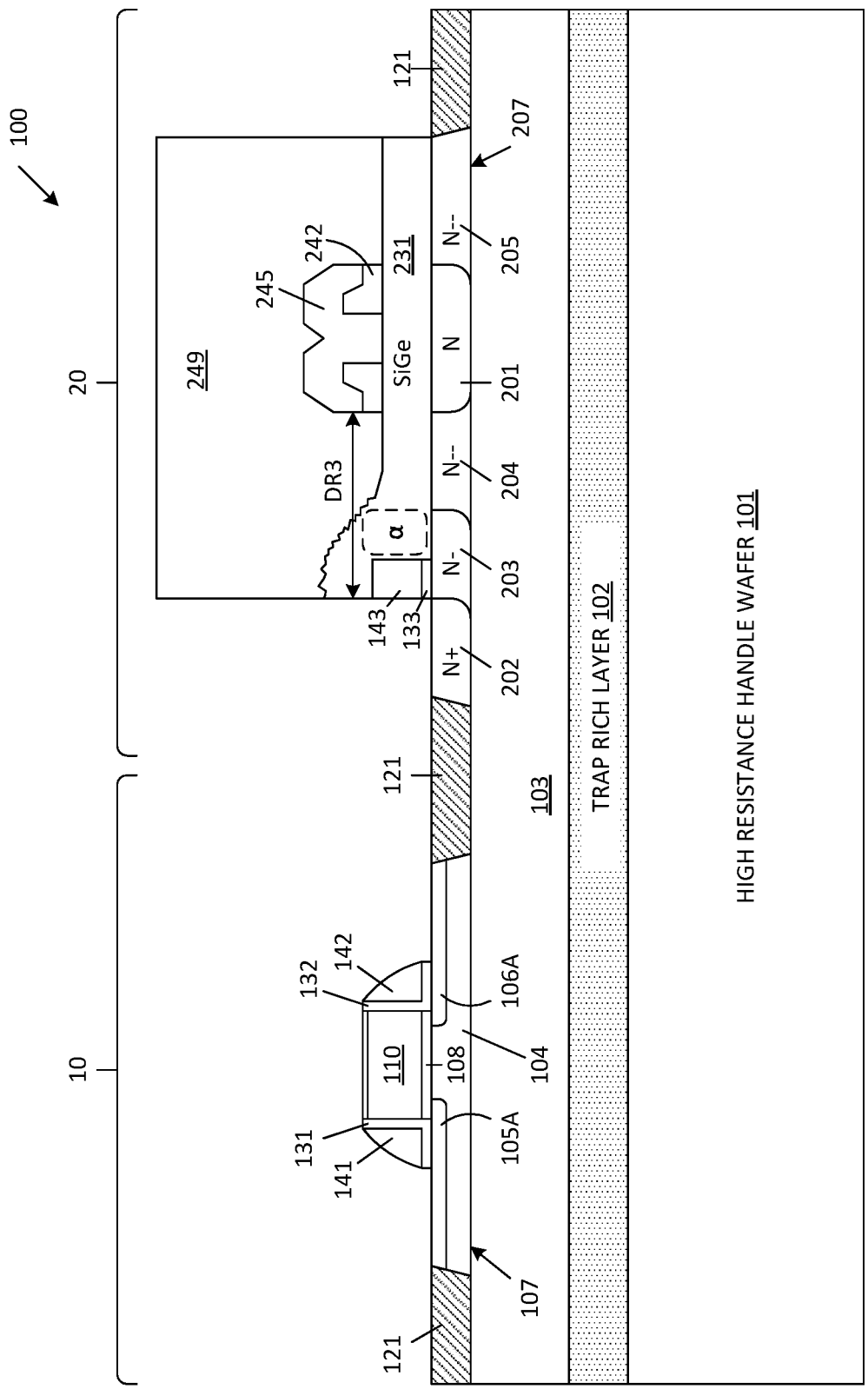

As illustrated by FIG. 2I, a photoresist mask 249 is formed over the resulting structure, wherein mask 249 defines the boundaries of the base region 231 of the SOI HBT device 21. Note that the mask 249 is dimensioned to overlap the silicon nitride spacer section 140A and the silicon oxide section 130A over the extrinsic collector region 203. As illustrated by FIG. 2J, a series of etches is performed through mask 249. A first etch removes the exposed portions of SiGe layer 230, thereby leaving p-type SiGe base region 231. The exposed portions of the silicon nitride spacer section 140 are then etched back, thereby leaving silicon nitride sidewall spacers 141-142 adjacent to gate electrode 110, and silicon nitride spacer 143 over extrinsic collector region 203. The exposed portions of thin silicon oxide section 130A are then removed, thereby leaving sidewall oxide structures 131-132 adjacent to gate electrode 110, and oxide spacer 133 over extrinsic collector region 203.

The distance (DR3) from the left edge of polysilicon emitter 245 to the left edge of the SiGe base region 231 is selected to overlap with the distance DR2, such that dielectric spacer structures 133/143 remain over the extrinsic collector region 203.

As illustrated by FIG. 1, mask 1201 is removed, and additional conventional processing steps are performed to provide connections to the SOI CMOS device 11 and the SOI HBT device 21. More specifically, N+ source/drain contact regions 105B and 106B are formed in SOI region 104 (aligned with sidewall spacers 141-142), thereby completing source/drain regions 105 and 106, respectively, of SOI CMOS device 11. Self-aligned metal silicide regions 151-157 are formed over source/drain contact region 105B, gate electrode 110, source/drain contact region 106B, collector contact region 202, SiGe base region 231, and polysilicon emitter region 245, as illustrated. Note that dielectric spacer structure 133/143 prevents the formation of metal silicide between the SiGe base region 231 and the heavily doped (N+) collector contact region 202. Pre-metal dielectric layers 251 and 252 are formed over the resulting structure, and metal contacts 261-266 are formed through the pre-metal dielectric layers 251-252 to contact the metal silicide regions 151-156, as illustrated.

Figure 3D:
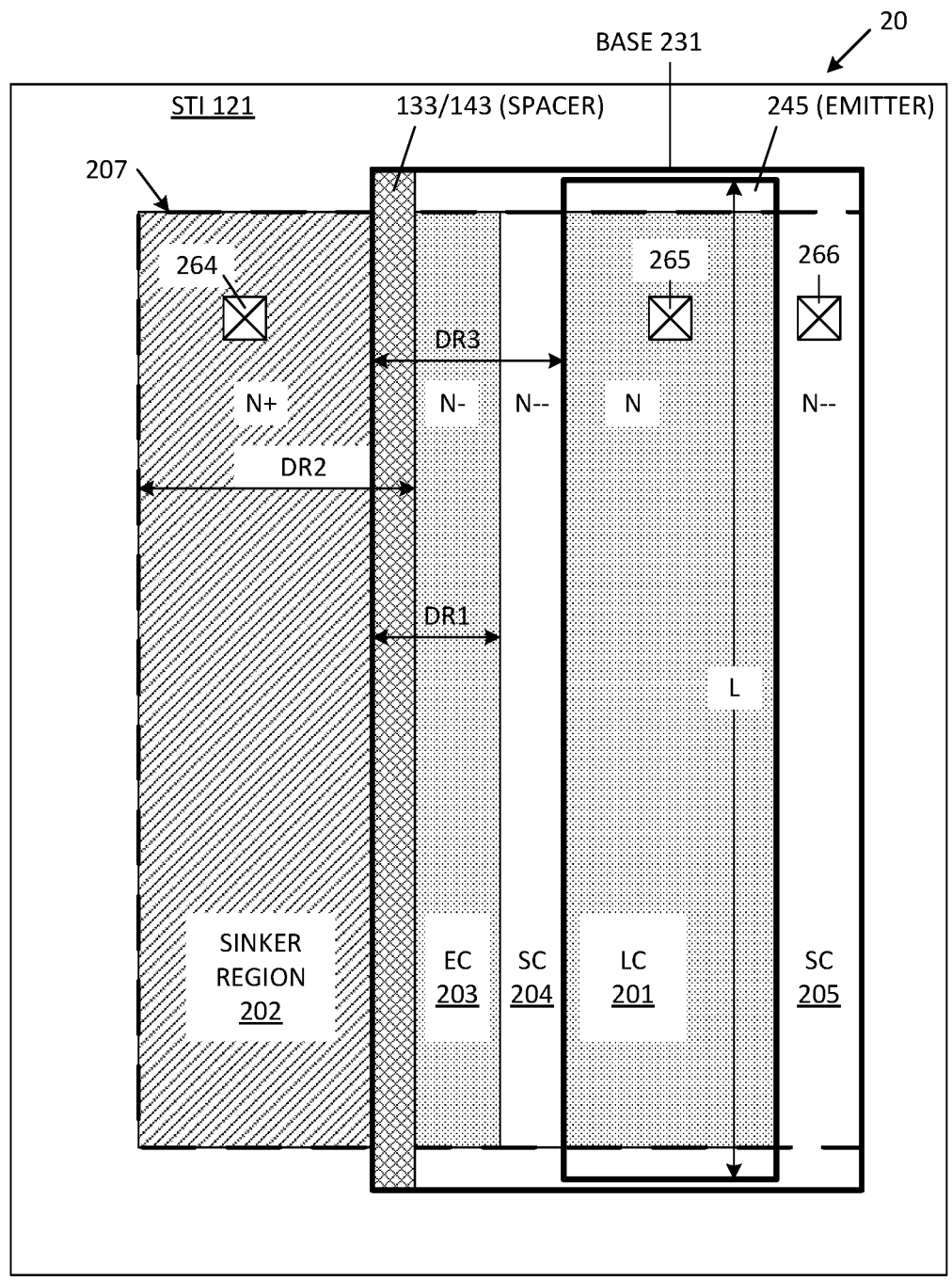

FIG. 3D is a top layout view of SOI HBT region 20 after the metal contacts have been formed, which illustrates spacer elements 133/143, SiGe base region 231, emitter region 245 and contacts 264-266, in accordance with one embodiment of the present invention.

In accordance with one embodiment, the final layout of SOI HBT device 21 is optimized so there is a minimum gap (G) between the local collector region 201 and the extrinsic collector region 203. In accordance with one embodiment, this gap G is aligned with the left edge of the emitter 245, as illustrated by FIG. 1. Note that the gap G separates the intrinsic base region from the extrinsic base region and presents the highest resistance in the path of current flow from intrinsic collector the outside world, limiting device performance.

Figure 4:
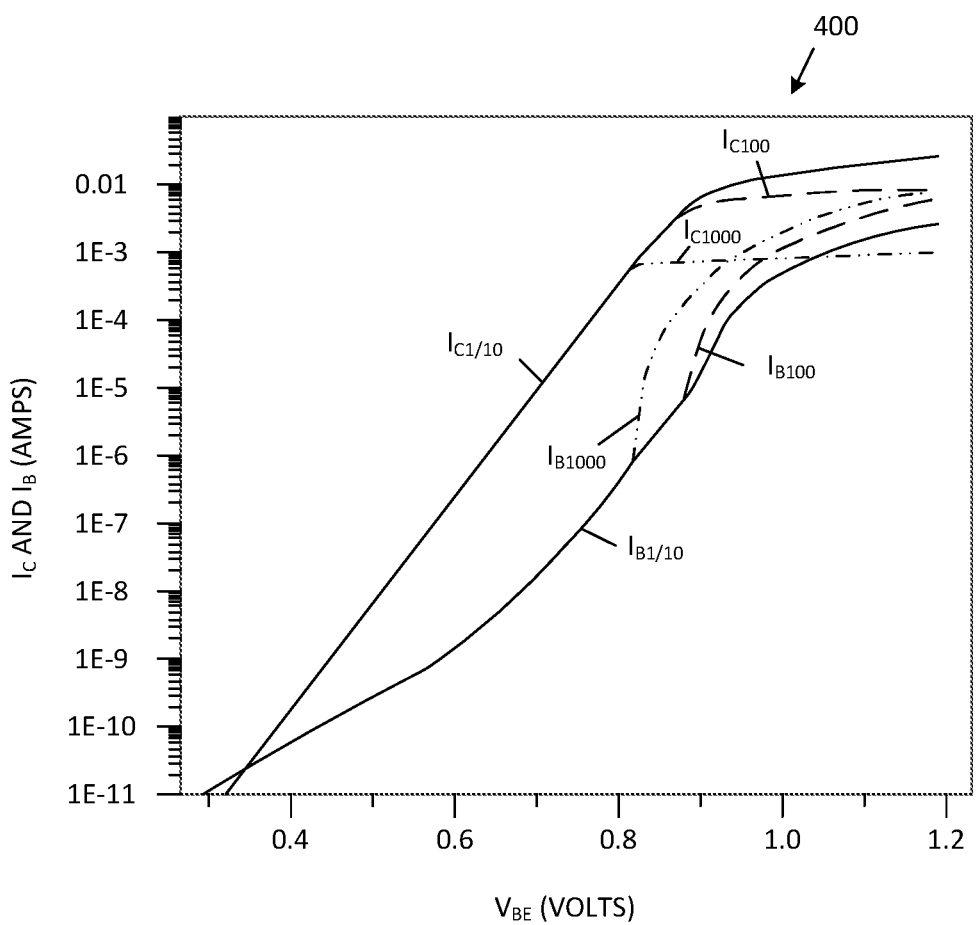
FIG. 4 is a graph that plots simulated collector currents $I_C$ and base currents $I_B$ versus the base-emitter voltages $V_{BE}$ of state-of-the-art SiGe HBT devices fabricated in a bulk silicon substrate, wherein different resistances have been artificially added in series with the collectors of the bulk SiGe HBT devices to show the effects of additional parasitic collector resistance that may be incurred when the devices are built on SOI substrates.

FIG. 4 is a graph 400 that plots simulated collector currents $I_C$ and base currents $I_B$ versus the base-emitter voltages $V_{BE}$ of state-of-the-art SiGe HBT devices fabricated in a bulk silicon substrate, wherein different resistances have been artificially added in series with the collectors of the bulk SiGe HBT devices. Thus, curve $I_{C1/10}$ represents the collector current through a bulk SiGe HBT device having an added collector resistance of 1 Ohm (or 10 Ohms). Note that there is no significant difference between the addition of a 1 Ohm resistor or a 10 Ohm resistor to the collector of the bulk SiGe HBT device. Curve $I_{C100}$ represents the collector current through a bulk SiGe HBT device having an added collector resistance of 100 Ohms, and curve $I_{C1000}$ represents the collector current through a bulk SiGe HBT device having an added collector resistance of 1000 Ohms.

Similarly, curve $I_{B2/10}$ represents the base current through a bulk SiGe HBT device having an added collector resistance of 1 Ohm (or 10 Ohms). Again, there is no significant difference between the addition of a 1 Ohm resistor or a 10 Ohm resistor to the collector of the bulk SiGe HBT device. Curve $I_{B100}$ represents the base current through a bulk SiGe HBT device having an added collector resistance of 100 Ohms, and curve $I_{B1000}$ represents the base current through a bulk SiGe HBT device having an added collector resistance of 1000 Ohms.

Figure 5:
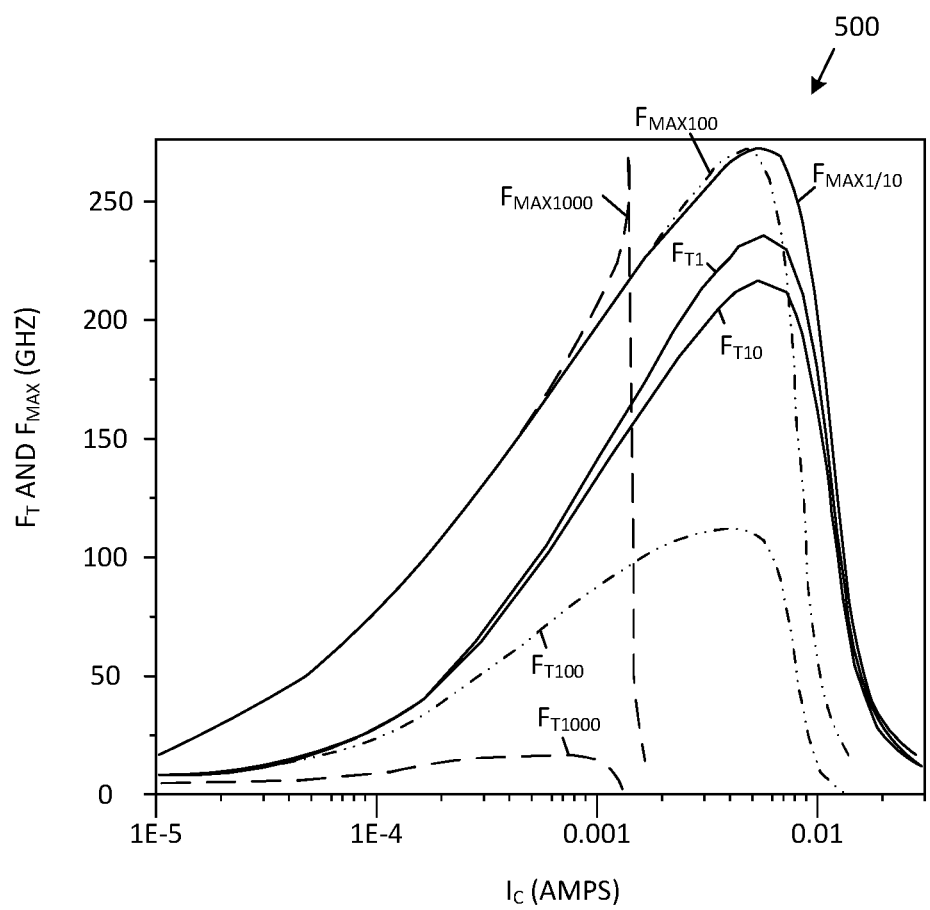
FIG. 5 is a graph that plots simulated $F_{MAX}$ and $F_T$ versus the collector current ($I_C$) of the bulk SiGe HBT devices of FIG. 4, wherein different resistances have been artificially added in series with the collectors of the bulk SiGe HBT devices to show the effects of additional parasitic collector resistance that may be incurred when the devices are built on SOI substrates.

FIG. 5 is a graph 500 that plots simulated F (i.e., the frequency at which a power gain of 0 dB is obtained from the transistor) and $F_T$ (i.e., the frequency at which the current gain of the transistor is 0 dB) versus the collector current ($I_C$) of bulk SiGe HBT devices, wherein different resistances have been artificially added in series with the collectors of the bulk SiGe HBT devices. Thus, curves $F_{MAX1/10}$, $F_{MAX100}$ and $F_{MAX1000}$ represent $F_{MAX}$ values of a bulk SiGe HBT device having added collector resistances of 1-10 Ohms, 100 Ohms and 1000 Ohms, respectively. Similarly, curves $F_{T1}$, $F_{T10}$, $F_{T100}$ and $F_{T1000}$ represent $F_T$ values of a bulk SiGe HBT device having added collector resistances of 1 Ohm, 10 Ohms, 100 Ohms and 1000 Ohms, respectively.

As illustrated by the data of FIGS. 4 and 5, a bulk SiGe HBT device having an added series collector resistance of up to about 10 Ohms is tolerable in terms of maintaining the basic DC and RF performance of the device (i.e., adequate $I_C$ and $I_B$ currents over a normal range of $V_{BE}$ values, and adequate $F_T$ and $F_{MAX}$ values over a normal range of collector current values). Thus, in accordance with one embodiment, SOI HBT device 21 is designed such that the resistance of the collector regions 203-204 between the local collector region 201 and the collector contact region 202 exhibit a resistance of about 10 Ohms or less. As a result, the performance of SOI HBT device 21 is acceptable to implement amplifiers in the front end module of an RF transceiver.

Figure 6:
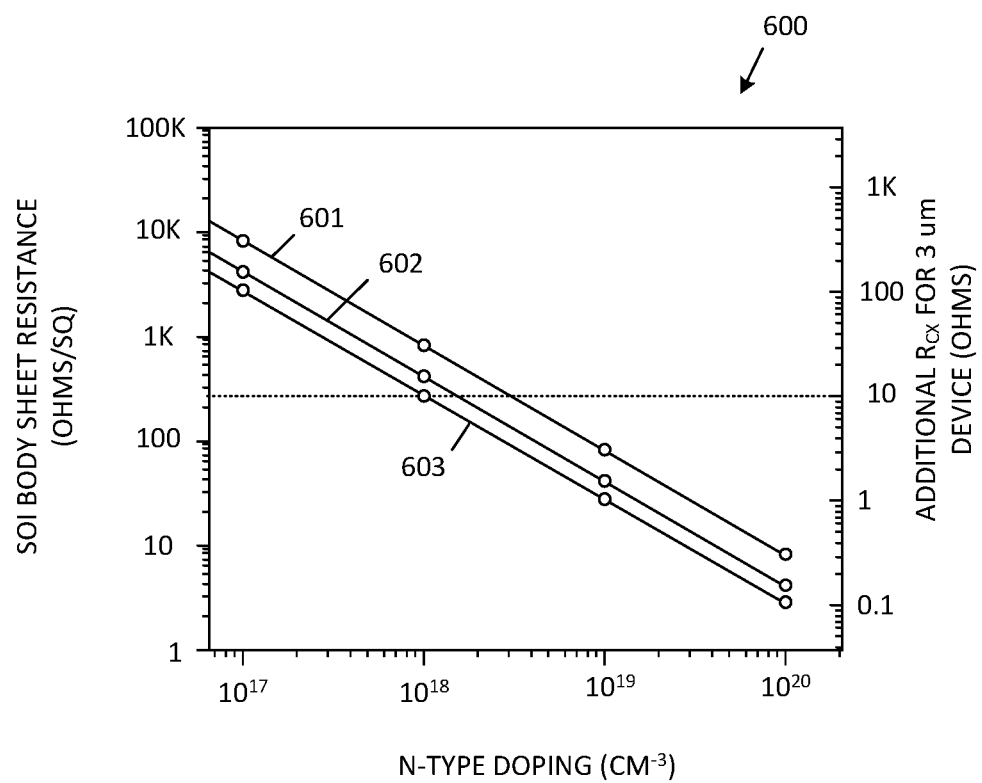
FIG. 6 is a graph illustrating the doping necessary to achieve a series collector resistance in an SOI HBT device that is less than a 10 Ohm threshold indicated by the graphs of FIGS. 4 and 5, in accordance with one embodiment of the present invention.

FIG. 6 is a graph 600 illustrating the doping necessary to achieve a series collector resistance below the 10 Ohm threshold indicated by graphs 400 and 500 (for a SOI HBT device 21 having a length (L) of 3 microns). Curves 601, 602 and 603 represent SOI layers having thicknesses of 400 Angstroms, 800 Angstroms and 1200 Angstroms, respectively. The right-hand abscissa of graph 600 (Ohms) is generated by multiplying the sheet resistance (Ohms/Square) (i.e., the left-hand abscissa of graph 600) by the approximate number of squares of SOI material between the local collector 201 and the external collector contact region 202. In accordance with one embodiment, (i.e., for collector regions 203 and 204 together having dimensions of DR3=0.12 um and L=3 um) there are approximately 0.04 squares of SOI material between the local collector 201 and the external collector contact region 202. In this embodiment, the goal of the design is to dope the SOI regions 203 and 204 high enough such that the total extrinsic collector resistance (i.e., the effective resistance of regions 203 and 204) is below 10 Ohms for a 3 micron long device. In accordance with curve 603, a dopant concentration greater than $10^{18}$ cm$^{-3}$ is required to provide a total extrinsic collector resistance of less than 10 Ohms for an SOI layer having a thickness of 1200 Angstroms. According to curve 602, a dopant concentration greater than about $1.5 \times 10^{18}$ cm$^{-3}$ is required to provide a total extrinsic collector resistance of less than 10 Ohms for an SOI layer having a thickness of 800 Angstroms. According to curve 601, a dopant concentration greater than about $3.1 \times 10^{18}$ cm$^{-3}$ is required to provide a total extrinsic collector resistance of less than 10 Ohms for an SOI layer having a thickness of 400 Angstroms. Note that the effective number of squares between the intrinsic collector 201 and the extrinsic collector 203 can be reduced by changing the layout geometry of the SOI HBT device, thereby assisting in reducing the total extrinsic collector resistance below 10 Ohms for a 3 micron long device.

In accordance with one embodiment of the present invention, transistors such as SOI CMOS transistor 11 and SOI HBT device 21 are used to implement an RF front end module (FEM) on a single wafer. Such an embodiment is described in more detail below.

Figure 7:
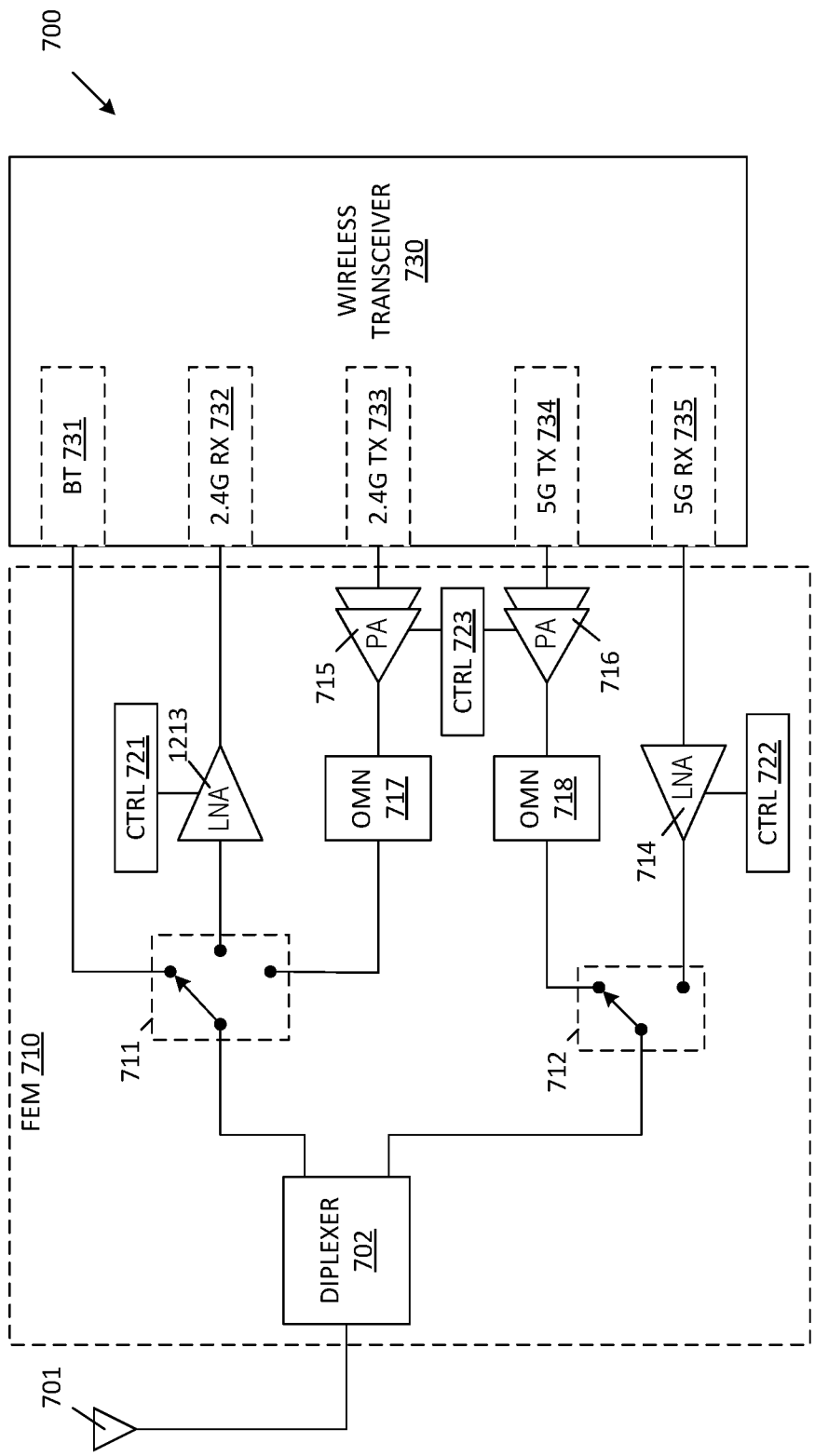
FIG. 7 is a block diagram of a dual-band wireless communication device that includes a front end module (FEM) that implements SOI CMOS devices and SOI HBT devices in accordance with one embodiment of the present invention.

FIG. 7 is a block diagram of a dual-band wireless communication device 700 that includes antenna 701, front end module (FEM) 710 and wireless transceiver 730. Front end module 710 includes diplexer 702, radio frequency (RF) switches 711-712, low-noise amplifiers (LNAs) 713-714, power amplifiers 715-716, output impedance matching networks (OMNs) 717-718 and bias/control circuits 721-723. Wireless transceiver 730 includes a Bluetooth port 731, 2.4 GHz receive port 732, a 2.4 GHz transmit port 733, a 5 GHz transmit port 734 and a 5 GHz receive port 735. RF switch 711 has a first position that couples antenna 701 to Bluetooth port 731, a second position that couples antenna 701 to the 2.4 GHz receive port 732 (through LNA 713) and a third position that couples antenna 701 to the 2.4 GHz transmit port 733 (through power amplifier 715 and OMN 717). RF switch 712 has a first position that couples antenna 701 to the 5 GHz transmit port 734 (through power amplifier 716 and OMN 718) and a second position that couples antenna 701 to the 5 GHz receive port 735 (through LNA 714). LNAs 713 and 714 are controlled by bias/control circuits 721-722, respectively. Power amplifiers 715-716 are controlled by bias/control circuit 723.

As described above, it is desirable for all of the elements of FEM 710 to be integrated on a single wafer in order to reduce system size, cost and complexity. Accordingly, in one embodiment of the present invention, the elements of FEM 710 are fabricated on a single wafer using the method of FIGS. 1 and 2A-2J. More specifically, the RF switches 711-712, and bias/control circuits 721-723 of FEM 710 are implemented using SOI CMOS transistors similar to SOI CMOS transistor 11. LNAs 713-714 and power amplifiers 715-716 are implemented using SOI HBTs similar to SOI HBT device 21. Output impedance matching networks 717-718 and diplexer 702 are implemented by passive devices fabricated over the substrate 101 (e.g., resistors, inductors, transmission lines, metal-insulator-metal (MIM) devices). These passive devices all benefit from the use of high-resistivity substrate 101, as eddy currents induced in the substrate below these passive devices are reduced, enabling higher quality (lower loss passive devices).

Accordingly, the present invention enables the integration of high performance RF switches on the same wafer as high performance SiGe BiCMOS devices by adapting the construction of the SiGe HBT devices to work within the limitations of the thin-film SOI starting material. The advantage of this method is that the RF switch device remains unchanged relative to the parent SOI CMOS process, while adequate SOI HBT devices are co-integrated on the same wafer without any additional complex processing steps, but rather, only implementing layout changes.

Although the present invention has been described in connection with a specific application that includes the integration of RF switches and amplifiers of a FEM, it is understood that the present invention can be readily used in other applications that would benefit from the integration of SOI CMOS transistors and SOI HBT devices on the same wafer, including, but not limited to, the co-integration of circuits used to implement silicon photonics devices.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:
1. A semiconductor structure comprising:
a semiconductor substrate;
a buried dielectric layer located over the semiconductor substrate;
a first thin silicon region located over the buried dielectric layer, wherein a silicon-on-insulator (SOI) CMOS transistor is fabricated in the first thin silicon region;
a second thin silicon region located over the buried dielectric layer, wherein a collector of a heterojunction bipolar transistor (HBT) device is fabricated in the second thin silicon region, wherein the first and second thin silicon regions have the same thickness;
a dielectric spacer structure located over a first portion of the collector;
a silicon germanium (SiGe) base region located over said collector, wherein a portion of the SiGe base region extends over said dielectric spacer structure;
an emitter located over the SiGe base region; and
a shallow trench isolation (STI) structure that isolates the SOI CMOS transistor from the collector of the HBT device, wherein the STI structure extends to the buried dielectric layer.

2. The semiconductor structure of claim 1, wherein the collector comprises:
a local collector region that extends entirely through the second thin silicon region, wherein the emitter is aligned over the local collector region;
an extrinsic collector region that extends entirely through the second thin silicon region; and
a sub-collector region that extends entirely through the second thin silicon region and separates the local collector region and the extrinsic collector region.

3. The semiconductor structure of claim 2, wherein the collector further comprises a collector contact region that is continuous with the extrinsic collector region.

4. The semiconductor structure of claim 2, wherein the local collector region and the extrinsic collector region have different dopant concentrations.

5. A semiconductor structure comprising:
a semiconductor substrate;
a buried dielectric layer located over the semiconductor substrate;
a first thin silicon region located over the buried dielectric layer, wherein a silicon-on-insulator (SOI) CMOS transistor is fabricated in the first thin silicon region;
a second thin silicon region located over the buried dielectric layer, wherein a collector of a heterojunction bipolar transistor (HBT) device is fabricated in the second thin silicon region, and wherein the collector comprises:
a local collector region that extends entirely through the second thin silicon region;
an extrinsic collector region that extends entirely through the second thin silicon region; and
a sub-collector region that extends entirely through the second thin silicon region and separates the local collector region and the extrinsic collector region, wherein the extrinsic collector region and the sub-collector region have a series resistance of about 10 Ohms or less; and
a shallow trench isolation (STI) structure that isolates the SOI CMOS transistor from the collector of the HBT device, wherein the STI structure extends to the buried dielectric layer.

6. A front-end module for a radio frequency (RF) device comprising:
a semiconductor substrate;
a buried dielectric layer located over the semiconductor substrate;
an RF switch including a silicon-on-insulator (SOI) CMOS transistor fabricated in a first thin silicon region located over the buried dielectric layer;
an amplifier coupled to the RF switch, wherein the amplifier includes a heterojunction bipolar transistor (HBT) device fabricated in a second thin silicon region located over the buried dielectric layer, wherein the first and second thin silicon regions have the same thickness, wherein the heterojunction bipolar transistor (HBT) device includes a collector fabricated in the second thin silicon region, a dielectric spacer structure located over a first portion of the collector, a silicon germanium (SiGe) base region located over said collector, wherein a portion of the SiGe base region extends over said dielectric spacer structure, and an emitter located over the SiGe base region;
and a shallow trench isolation (STI) structure that isolates the SOI CMOS transistor from the collector of the HBT device, wherein the STI structure extends to the buried dielectric layer.

7. A semiconductor structure comprising:
a semiconductor substrate;
a buried dielectric layer located over the semiconductor substrate;
a first thin silicon region located over the buried dielectric layer, wherein a silicon-on-insulator (SOI) CMOS transistor is fabricated in the first thin silicon region;
a second thin silicon region located over the buried dielectric layer, wherein a collector of a heterojunction bipolar transistor (HBT) device is fabricated in the second thin silicon region;
a dielectric spacer structure located over a first portion of the collector;
a silicon germanium (SiGe) base region located over said collector, wherein a portion of the SiGe base region extends over said dielectric spacer structure, wherein an edge of said dielectric spacer structure is aligned with an edge of the SiGe base region;
an emitter located over the SiGe base region; and
a shallow trench isolation (STI) structure that isolates the SOI CMOS transistor from the collector of the HBT device, wherein the STI structure extends to the buried dielectric layer.

8. The semiconductor structure of claim 2, wherein the local collector has a first dopant concentration, the extrinsic collector region has a second dopant concentration, less than the first dopant concentration, and the sub-collector region has a third dopant concentration, less than the second dopant concentration.

9. The semiconductor structure of claim 3, wherein the collector contact region has a first dopant concentration, the local collector has a second dopant concentration that is less than the first dopant concentration, the extrinsic collector region has a third dopant concentration that is less than the second dopant concentration, and the sub-collector region has a fourth dopant concentration that is less than the third dopant concentration.

10. The semiconductor structure of claim 4, wherein the local collector region is more heavily doped than the extrinsic collector region.

11. The semiconductor structure of claim 1, wherein the SOI CMOS transistor includes dielectric sidewall spacers formed adjacent to a gate electrode, wherein the dielectric sidewall spacers and the dielectric spacer structure are formed from a common dielectric layer.

12. A front end module for a radio frequency (RF) device comprising:
a semiconductor substrate;
a buried dielectric layer located over the semiconductor substrate;
an RF switch including a silicon-on-insulator (SOI) CMOS transistor fabricated in a first thin silicon region located over the buried dielectric layer;
an amplifier coupled to the RF switch, wherein the amplifier includes a heterojunction bipolar transistor (HBT) device fabricated in a second thin silicon region located over the buried dielectric layer, wherein the heterojunction bipolar transistor (HBT) device includes a collector fabricated in the second thin silicon region, a dielectric spacer structure located over a first portion of the collector, a silicon germanium (SiGe) base region located over said collector, wherein a portion of the SiGe base region extends over said dielectric spacer structure, wherein an edge of said dielectric spacer structure is aligned with an edge of the SiGe base region, and an emitter located over the SiGe base region; and
a shallow trench isolation (STI) structure that isolates the SOI CMOS transistor from the collector of the HBT device, wherein the STI structure extends to the buried dielectric layer.

13. The front end module of claim 6, wherein the collector comprises:
a local collector region that extends entirely through the second thin silicon region, wherein the emitter is aligned over the local collector region;
an extrinsic collector region that extends entirely through the second thin silicon region; and
a sub-collector region that extends entirely through the second thin silicon region and separates the local collector region and the extrinsic collector region.

14. The front end module of claim 13, wherein the local collector has a first dopant concentration, the extrinsic collector region has a second dopant concentration, less than the first dopant concentration, and the sub-collector region has a third dopant concentration, less than the second dopant concentration.

15. The front end module of claim 14, wherein the collector further comprises a collector contact region that is continuous with the extrinsic collector region.

16. The front end module of claim 15, wherein the collector contact region has a first dopant concentration, the local collector has a second dopant concentration that is less than the first dopant concentration, the extrinsic collector region has a third dopant concentration that is less than the second dopant concentration, and the sub-collector region has a fourth dopant concentration that is less than the third dopant concentration.

17. The front end module of claim 13, wherein the extrinsic collector region and the sub-collector region have a series resistance of about 10 Ohms or less.

18. The front end module of claim 6, wherein the SOI CMOS transistor includes dielectric sidewall spacers formed adjacent to a gate electrode, wherein the dielectric sidewall spacers and the dielectric spacer structure are formed from a common dielectric layer.

19. The semiconductor structure of claim 1, wherein the first and second thin silicon regions have a thickness of about 100 nanometers.

20. The semiconductor structure of claim 1, wherein the first and second thin silicon regions have a thickness in the range of 400 to 1200 Angstroms.

21. The front end module of claim 6, wherein the first and second thin silicon regions have a thickness of about 100 nanometers.

22. The front end module of claim 6, wherein the first and second thin silicon regions have a thickness in the range of 400 to 1200 Angstroms.

* * * * *